(12) United States Patent
Shinohara et al.

(10) Patent No.: US 10,121,705 B2
(45) Date of Patent: Nov. 6, 2018

(54) SEMICONDUCTOR DEVICE AND METHOD OF MANUFACTURING THE SAME

(71) Applicant: Renesas Electronics Corporation, Kawasaki-shi (JP)

(72) Inventors: Hirofumi Shinohara, Kawasaki (JP); Hidekazu Oda, Kawasaki (JP); Toshiaki Iwamatsu, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/469,920

(22) Filed: Aug. 27, 2014

(65) Prior Publication Data
US 2015/0137239 A1    May 21, 2015

(30) Foreign Application Priority Data
Nov. 21, 2013 (JP) .................. 2013-240906

(51) Int. Cl.
*H01L 21/8234* (2006.01)
*H01L 21/8238* (2006.01)
(Continued)

(52) U.S. Cl.
CPC ........ *H01L 21/823814* (2013.01); *H01L 21/823418* (2013.01); *H01L 21/84* (2013.01);
(Continued)

(58) Field of Classification Search
CPC ......... H01L 21/8234; H01L 21/823412; H01L 21/823807
See application file for complete search history.

(56) References Cited

U.S. PATENT DOCUMENTS

2001/0025997 A1  10/2001 Onishi
2006/0131656 A1* 6/2006 Shin ............... H01L 21/265
257/369
(Continued)

FOREIGN PATENT DOCUMENTS

EP    0 336 515 A1   4/1989
JP    H06-77479 A    3/1994
(Continued)

OTHER PUBLICATIONS

Japanese Office Action dated Aug. 29, 2017, with an English translation.
(Continued)

*Primary Examiner* — Jae Lee
(74) *Attorney, Agent, or Firm* — McGinn IP Law Group, PLLC

(57) ABSTRACT

To suppress performance degradation of a semiconductor device, when the width of a first active region having a first field effect transistor formed therein is smaller than the width of a second active region having a second field effect transistor formed therein, the height of a surface of a first raised source layer of the first field effect transistor is made larger than the height of a surface of a second raised source layer of the second field effect transistor. Moreover, the height of a first surface of a raised drain layer of the first field effect transistor is made larger than a surface of a second raised drain layer of the second field effect transistor.

18 Claims, 18 Drawing Sheets

(51) Int. Cl.
*H01L 27/092* (2006.01)
*H01L 21/84* (2006.01)
*H01L 27/088* (2006.01)
*H01L 27/11* (2006.01)
*H01L 27/12* (2006.01)

(52) U.S. Cl.
CPC ........ *H01L 27/088* (2013.01); *H01L 27/0922* (2013.01); *H01L 27/1104* (2013.01); *H01L 27/1203* (2013.01)

(56) References Cited

U.S. PATENT DOCUMENTS

| | | |
|---|---|---|
| 2006/0194405 A1 | 8/2006 | Nagano et al. |
| 2007/0152244 A1 | 7/2007 | Ahn |
| 2009/0121256 A1* | 5/2009 | Shin .................. H01L 29/41783 257/190 |
| 2011/0235407 A1* | 9/2011 | Lim ........................ H01L 27/11 365/156 |
| 2011/0287611 A1 | 11/2011 | Cheng et al. |
| 2012/0049284 A1* | 3/2012 | Doris .................. H01L 27/1211 257/350 |
| 2013/0087855 A1* | 4/2013 | Makiyama ............. H01L 21/84 257/350 |
| 2014/0001561 A1* | 1/2014 | Cheng ............. H01L 21/823807 257/369 |
| 2014/0353717 A1* | 12/2014 | Loubet .................. H01L 27/092 257/192 |
| 2015/0001623 A1* | 1/2015 | Wang ................ H01L 29/78654 257/347 |

FOREIGN PATENT DOCUMENTS

| | | |
|---|---|---|
| JP | 2000-183355 A | 6/2000 |
| JP | 2001-267431 A | 9/2001 |
| JP | 2006-237509 A | 9/2006 |
| JP | 2010-45394 A | 2/2010 |
| JP | 2011-018137 A | 1/2011 |
| JP | 2011-238745 A | 11/2011 |
| JP | 2011-253857 A | 12/2011 |
| WO | WO 2011/141973 A1 | 11/2011 |

OTHER PUBLICATIONS

Taiwanese Office Action dated Mar. 30, 2018, with an English translation.
Chinese Office Action dated Jun. 19, 2018 with an English translation.
Japanese Office Action dated Aug. 14, 2018.

* cited by examiner

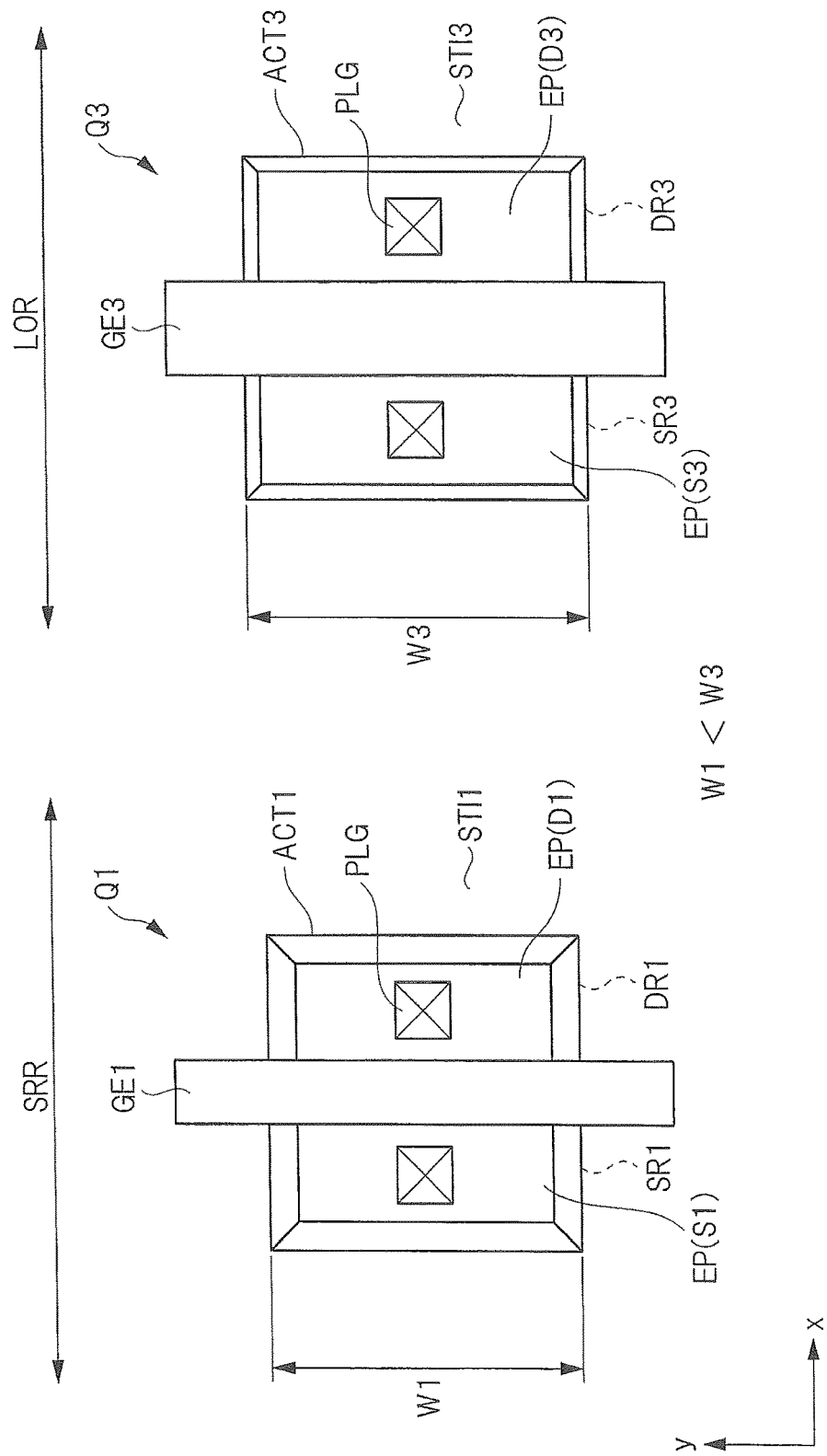

SEMICONDUCTOR DEVICE AND METHOD OF MANUFACTURING THE SAME

CROSS-REFERENCE TO RELATED APPLICATION

The present application claims priority from Japanese Patent Application No. 2013-240906 filed on Nov. 21, 2013, the content of which is hereby incorporated by reference into this application.

TECHNICAL FIELD

The present invention relates to a semiconductor device and a technique of manufacturing the same. More particularly, the present invention relates to a technique effectively applied to, for example, a semiconductor device having a field effect transistor formed on its active region and a technique of manufacturing the same.

BACKGROUND

Japanese Patent Application Laid-Open Publication No. 2010-45394 (Patent Document 1) discloses a technique of epitaxially growing a raised silicon layer on a source region and a drain region by selectively growing silicon (S1).

SUMMARY

For example, a field effect transistor is formed in an active region sectioned by device isolation regions, and in this case, if an edge portion of the active region in contact with the device isolation region is oxidized by an oxidation process (thermal treatment process) carried out in a manufacturing process of a semiconductor device, the width of the active region might become narrower than a design value. In such a case, since the electric current of the field effect transistor is lowered to cause a decrease of its performance, there is room for improvement from the viewpoint of suppressing the performance decrease of the semiconductor device.

The above and other preferred aims and novel characteristics of the present invention will be apparent from the description of the present specification and the accompanying drawings.

In accordance with one embodiment, a semiconductor device is designed such that in the case when the width of a first active region on which a first field effect transistor is formed is smaller than the width of a second active region on which a second field effect transistor is formed, the height of the surface of a first raised source layer of the first field effect transistor is made larger than the height of the surface of a second raised source layer of the second field effect transistor. Moreover, the height of the surface of a first raised drain layer of the first field effect transistor is made larger than the height of the surface of a second raised drain layer of the second field effect transistor.

In a method for manufacturing a semiconductor device in accordance with one embodiment for achieving the configuration of the above-mentioned semiconductor device, by using selective epitaxial growth having the same condition in which dichlorosilane and hydrogen chloride are contained in a source gas, a process of simultaneously forming the first raised source layer, the first raised drain layer, the second raised source layer and the second raised drain layer is provided.

In accordance with the above-mentioned embodiment, it becomes possible to suppress performance degradation of a semiconductor device.

BRIEF DESCRIPTIONS OF THE DRAWINGS

FIG. 18 is a diagram illustrating a plane configuration of a field effect transistor in accordance with a modification example.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, the description of the same or similar portions is not repeated in principle unless particularly required in the following embodiments. Also, in some drawings used in the embodiments, hatching is used even in a plan view so as to make the drawings easy to see.

Embodiments

<Example of Semiconductor Chip Configuration>

Figure 1:
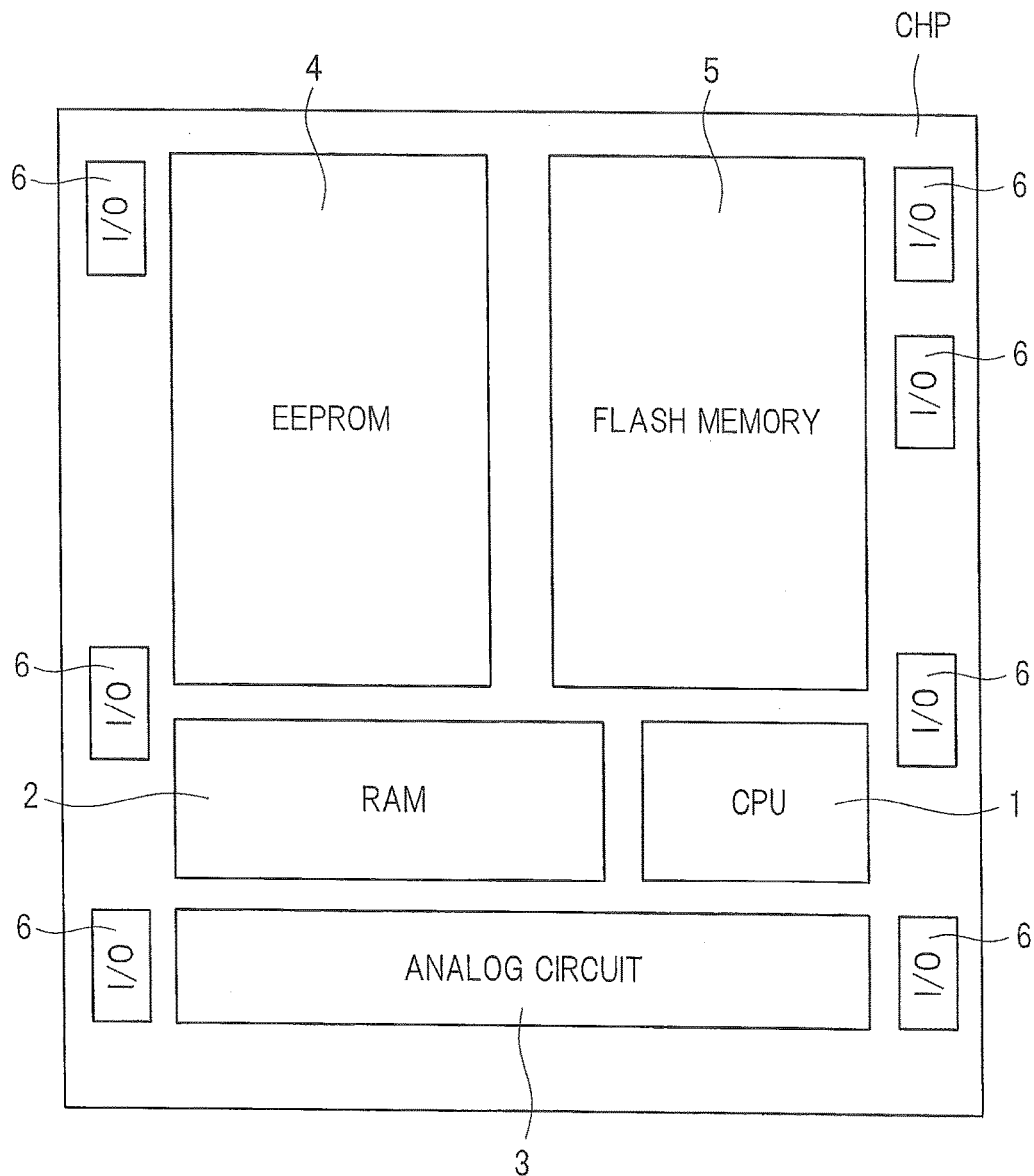
FIG. 1 is a diagram illustrating an example of a layout configuration of a semiconductor chip in accordance with an embodiment.

Referring to drawings, the following description will explain a semiconductor device in accordance with the present embodiment. First, an explanation will be given to a layout configuration of a semiconductor chip in which a system including a microcomputer is formed. FIG. 1 is a diagram illustrating an example of a layout configuration of a semiconductor chip CHP in accordance with the present embodiment. In FIG. 1, the semiconductor chip CHP includes a CPU (Central Processing Unit) 1, a RAM (Random Access Memory) 2, an analog circuit 3, an EEPROM (Electrically Erasable Programmable Read Only Memory) 4, a flash memory 5 and an I/O (Input/Output) circuit 6.

The CPU (circuit) 1 is also referred to as a central processing unit, and forms the heart of a computer or the like. The CPU 1 reads an instruction from a storage unit, and decodes it, and based upon the instruction, it executes various operations and controlling processes.

The RAM (circuit) 2 is a memory from which stored information is randomly read out, that is, stored information stored therein as needed is read out randomly, and in which stored information is newly written, and is also referred to as a memory capable of carrying out writing and reading operations therein and therefrom as needed. As the RAMs serving as IC memories, there are two types thereof, that is, a DRAM (Dynamic RAM) using a dynamic circuit and an SRAM (Static RAM) using a static circuit. The DRAM is a reading and writing memory as needed, which needs a storage holding operation, and the SRAM is a reading and writing memory as needed, which needs no storage holding operation. In the present embodiment, it is supposed that the RAM 2 is constituted by an SRAM.

The analog circuit 3, which is a circuit that deals with a signal of a voltage or an electric current that is continuously varied with time, that is, an analog signal, is constituted by, for example, an amplification circuit, a conversion circuit, a modulation circuit, an oscillation circuit, a power-supply circuit, and the like.

The EEPROM 4 and the flash memory 5 are one type of non-volatile memories that are electrically rewritable in both of writing and erasing operations, and are also referred to as programmable read-only memories capable of being electrically erasable. The memory cell of each of the EEPROM 4 and the flash memory 5 is constituted by, for example, a storage (memory) MONOS (Metal Oxide Nitride Oxide Semiconductor)-type transistor or MNOS (Metal Nitride Oxide Semiconductor)-type transistor. For writing operation and erasing operation of the EEPROM 4 and the flash memory 5, for example, a Fowler-Nordheim tunneling phenomenon is utilized. Additionally, hot electrons and hot holes may be used for carrying out a writing operation and an erasing operation. The difference between the EEPROM 4 and the flash memory 5 lies in that the EEPROM 4 is a non-volatile memory capable of carrying out an erasing process, for example, based upon a byte unit, while the flash memory 5 is a non-volatile memory capable of carrying out an erasing process based upon a word-line unit. In general, programs or the like used in executing various processes in a CPU 1 are stored in the flash memory 5. In contrast, various data having high frequency in writing are stored in the EEPROM 4.

The I/O circuit 6, which is an input/output circuit, serves as a circuit for outputting data to an apparatus connected from the inside of the semiconductor chip CHP to the outside of the semiconductor chip CHP and for inputting data from an apparatus connected to the outside of the semiconductor chip CHP to the inside of the semiconductor chip CHP.

The semiconductor chip CHP in accordance with the present embodiment is configured as described above, and among various circuits formed in the semiconductor chip CHP, an explanation will be given, in particular, with attention being focused on the SRAM forming the RAM 2 and a logic circuit forming the CPU 1.

<Configuration and Operations of SRAM>

Figure 2:
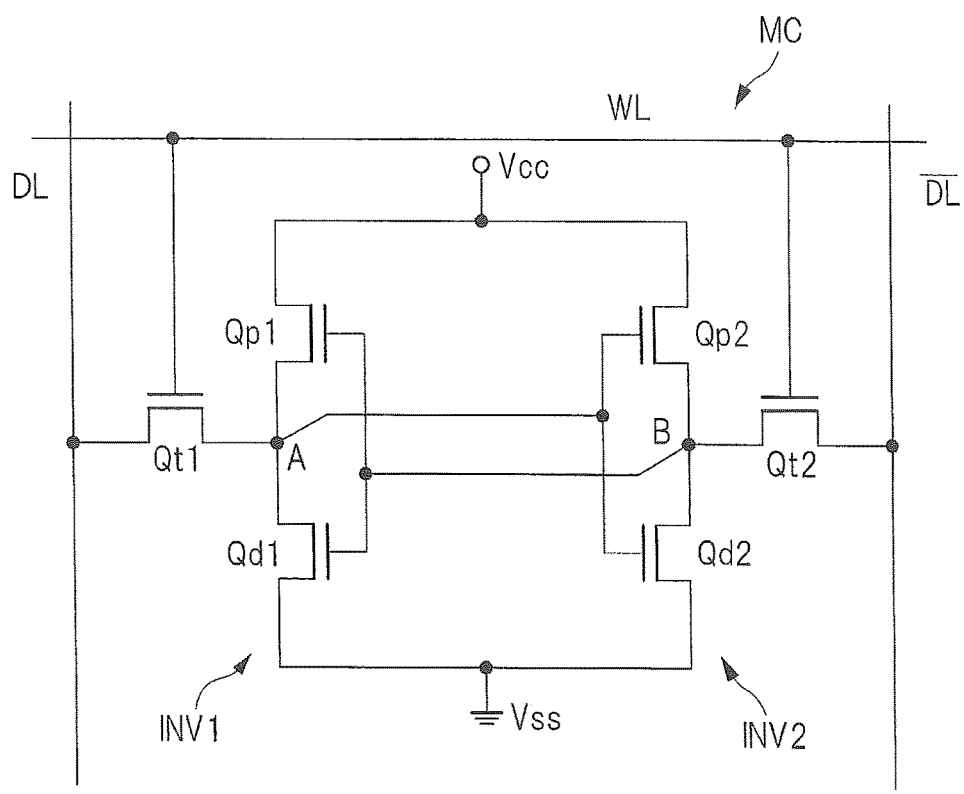
FIG. 2 is an equivalent circuit diagram showing an SRAM memory cell.

First, the following description will explain the equivalent circuit of a memory cell MC forming the SRAM. FIG. 2 is an equivalent circuit diagram showing the memory cell MC of the SRAM in the present embodiment. As illustrated in FIG. 2, this memory cell MC is disposed on a crossing portion between a pair of a complimentary data line (data line DL, data line /DL (bar DL)) and a word line WL, and is constituted by a pair of driving transistors Qd1 and Qd2, a pair of load transistors Qp1 and Qp2 and a pair of transfer transistors Qt1 and Qt2. The driving transistors Qd1 and Qd2 and the transfer transistors Qt1 and Qt2 are constituted by n-channel type field effect transistors, and the load transistors Qp1 and Qp2 are constituted by p-channel type field effect transistors.

Of the above-mentioned six transistors forming the memory cell MC, the driving transistor Qd1 and the load transistor Qp1 form a CMOS inverter INV1, and the driving transistor Qd2 and the load transistor Qp2 form a CMOS inverter INV2. Mutual input/output terminals (storage nodes A and B) of these paired CMOS inverters INV1 and INV2 are cross-coupled so as to form a flip-flop circuit serving as an information storage unit for storing 1-bit information. Moreover, one of the input/output terminals (storage node A) of the flip-flop circuit is connected to one of the source region and drain region of the transfer transistor Qt1, and the other input/output terminal (storage node B) is connected to one of the source region and drain region of the transfer transistor Qt2.

Moreover, the other of the source region and drain region of the transfer transistor Qt1 is connected to the data line DL, and the other of the source region and drain region of the transfer transistor Qt2 is connected to the data line /DL. Furthermore, one end of the flip-flop circuit (each of the source regions of the load transistors Qp1 and Qp2) is connected to a power supply voltage (Vcc), while the other end (each of the source regions of the driving transistors Qd1 and Qd2) is connected to a reference voltage (Vss).

The operations of the above-mentioned circuits are explained as follows: In the case when the storage node A of one of the CMOS inverters INV1 has a high potential ("H"), since the driving transistor Qd2 is turned ON, the storage node B of the other CMOS inverter INV2 becomes a low potential ("L"). Therefore, the driving transistor Qd1 is turned OFF so that the high potential ("H") of the storage node A is maintained. That is, by a latch circuit in which the paired CMOS inverters INV1 and INV2 are cross-coupled, the states of the mutual storage nodes A and B are maintained so that during a period in which the power supply voltage is being applied, information is stored.

The word line WL is connected to each of the gate electrodes of the transfer transistors Qt1 and Qt2, and the conduction and non-conduction of the transfer transistors Qt1 and Qt2 are controlled by the word line WL. In other words, in the case when the word line WL is in the high potential ("H") state, the transfer transistors Qt1 and Qt2 are turned ON so that since the latch circuit and the complementary data line (data line DL, /DL) are electrically connected, the potential state ("H" or "L") of the storage nodes A and B appears on the data line DL or /DL, and this is read out as information of the memory cell MC.

Upon writing information in the memory cell MC, while the word line WL is set to the "H" potential level, with the transfer transistors Qt1 and Qt2 being kept in the ON state, the information of the data line DL or /DL is transmitted to the storage nodes A and B. In a manner as described above, the SRAM can be operated.

<Configuration of Logic Circuit>

The above-mentioned CPU is constituted by logic circuits, and logic circuits having desired functions can be achieved by combinations of the inverter circuits, NAND circuits and NOR circuits. That is, the logic circuits forming the CPU1 include the inverter circuits, NAND circuits and NOR circuits. Thus, the CPU 1 reads out an instruction from the storage unit by combinations of the operation of the inverter circuit, the operation of the NAND circuit and the operation of the NOR circuit, and decodes the instruction, and based upon this, is allowed to execute various kinds of operations and controls.

<Room for Improvement>

In the above-mentioned SRAM and logic circuits, field effect transistors are used, and these field effect transistors are formed in active regions sectioned by device isolation regions. In this case, the field effect transistors to be used for the SRAM and logic circuits are constituted by miniaturized low breakdown voltage transistors. However, for example, as illustrated in FIG. 1, an I/O circuit 6 is also formed on a semiconductor chip so as to provide an interface with external circuits. For the I/O circuit 6, high breakdown voltage transistors are used. In other words, on the semiconductor chip CHP illustrated in FIG. 1, low breakdown voltage transistors and high breakdown voltage transistors, which are mutually different types, need to be formed. At this time, the film thickness of a gate insulating film of each of high breakdown voltage transistors is made larger than the film thickness of a gate insulating film of each of low breakdown voltage transistors so as to properly maintain the breakdown voltage. Moreover, upon forming the gate insulating film, an oxidation process (thermal treatment process), typically represented by, for example, a thermal oxidation method, is carried out. For this reason, in a manufacturing process of a semiconductor device that contains both of low breakdown voltage transistors and high breakdown voltage transistors, it is necessary to form not only the gate insulating film for the low breakdown voltage transistors with a thin film thickness, but also the gate insulating film for the high breakdown voltage transistors with a thick film thickness, thereby increasing the number of oxidation processes.

As a result, in the active regions sectioned by the device isolation regions, erosion of an oxide film from the border with the device isolation region into the end portion of the active region tends to easily occur due to the increase of the above-mentioned oxidation processes, resulting in a high possibility of the occurrence of a phenomenon in which the area (size) of the active region becomes smaller. When this phenomenon occurs, for example, the width of the active region in the gate width direction becomes narrower to cause a decrease of the electric current of the field effect transistor, and the subsequent performance degradation of the field effect transistor. Moreover, it is considered that the degrees of corrosion of the oxide film become different depending on the active regions on which a plurality of transistors are respectively formed. This means that the widths of the active regions on which the plural transistors are respectively formed become different, thereby causing deviations to occur in the electric current flowing through the plural transistors. In particular, in the case when the electric current deviations increase in the plural low breakdown voltage transistors that are miniaturized and constitute the SRAM, the operation margin tends to be lowered and the yield also tends to be lowered.

In this manner, in the case of a semiconductor device in which low breakdown voltage transistors forming the SRAM and logic circuits and high breakdown voltage transistors forming the I/O circuits are formed, the area of the active regions sectioned by the device isolation regions tends to easily deviate due to the increase of the oxidation processes (thermal treatment processes). In particular, in the case of a plurality of field effect transistors to be used in circuits having the same function that are formed in the active regions of the same size, although it is supposed that the same electric current is originally allowed to flow, the electric current value tends to deviate when deviations occur in the size of the active regions, resulting in performance degradation of the semiconductor device. In particular, in the case when the circuits having the same function are SRAMs, the reliability of the SRAM operations is lowered. This is caused not only when the circuits having the same function are SRAMs, but also when the circuits having the same functions are logic circuits, thereby lowering the operation reliability of the logic circuits. Therefore, in the case of a semiconductor device in which circuits having the same function are formed, with the low breakdown voltage transistor and the high breakdown voltage transistor being also formed, there is room for improvement, in particular, from the viewpoint of reducing electric current deviations caused among a plurality of field effect transistors used in circuits having the same function.

Figure 3:
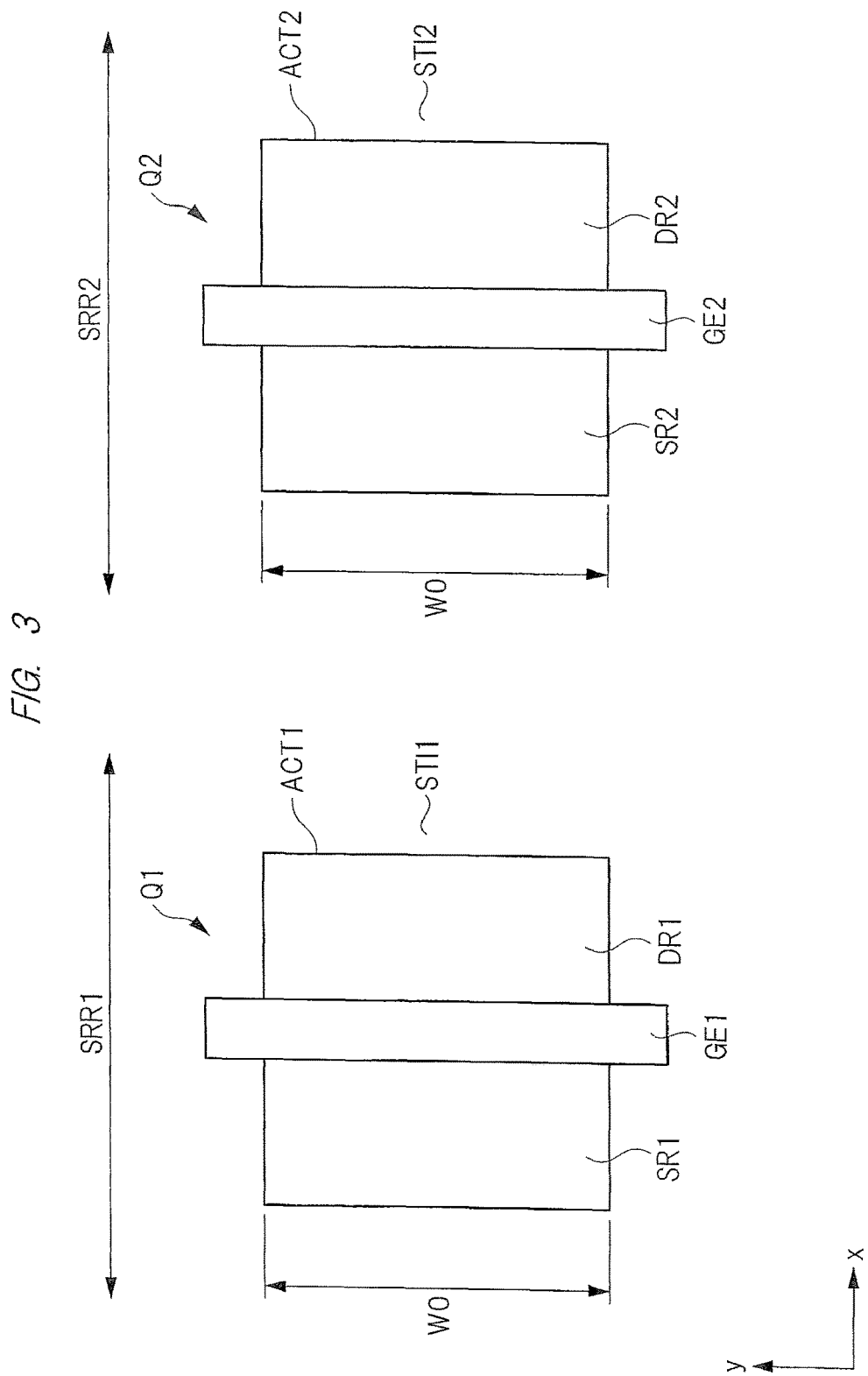
FIG. 3 is a diagram illustrating a plane configuration of a field effect transistor formed on each of a plurality of SRAM formation regions.

With respect to the room for improvement, an explanation will be given by exemplifying a plurality of field effect transistors used in circuits (SRAMs) having the same function. FIG. 3 is a diagram illustrating a plane configuration of field effect transistors respectively formed in an SRAM formation region SRR1 and an SRAM formation region SRR2. In FIG. 3, for example, an electric field transistor Q1 is formed in the SRAM formation region SRR1 and an electric field transistor Q2 is formed in the SRAM formation region SRR2. More specifically, as illustrated in FIG. 3, the field effect transistor Q1 is formed in an active region ACT1 having a rectangular shape sectioned by the device isolation regions STI1. In other words, the field effect transistor Q1 has a gate electrode GE1 that extends in a y-direction of FIG. 3 on the active region ACT1, and a source region SR1 and a drain region DR1 formed in a manner so as to sandwich the gate electrode GE1 within the active region ACT1. At this time, the width of the active region ACT1 in the gate width direction (y-direction) of the gate electrode GE1 is set to W0.

In the same manner, the field effect transistor Q2 is formed in an active region ACT2 having a rectangular shape sectioned by the device isolation regions STI2. In other words, the field effect transistor Q2 has a gate electrode GE2 that extends in the y-direction of FIG. 3 on the active region ACT2, and a source region SR2 and a drain region DR2 formed in a manner so as to sandwich the gate electrode GE2 within the active region ACT2. At this time, the width of the active region ACT2 in the gate width direction (y-direction) of the gate electrode GE2 is set to W0. In other words, as illustrated in FIG. 3, the width (W0) of the active region ACT1 on which the field effect transistor Q1 is formed and the width (W0) of the active region ACT2 on which the field effect transistor Q2 is formed are the same.

Figure 4:
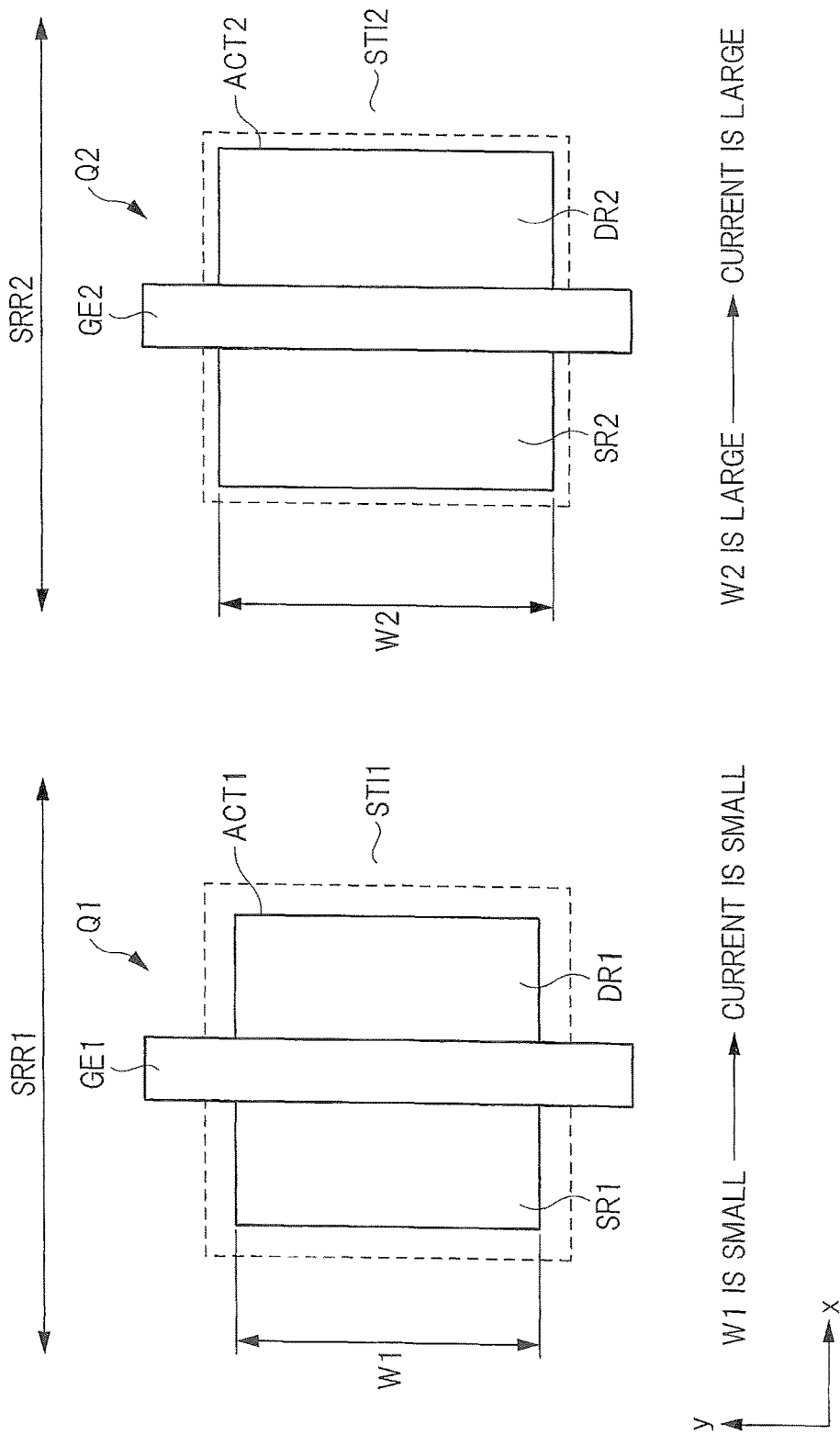
FIG. 4 is a diagram illustrating a plane configuration of the field effect transistor after occurrence of an erosion of an oxide film onto an end portion of an active region due to a thermal treatment process.

In the manufacturing process of the semiconductor device, however, various thermal treatment processes (oxidation processes) are carried out. As a result, as illustrated in FIG. 4, in the active region ACT1 sectioned by the device isolation regions STI1 and the active region ACT2 sectioned by the device isolation regions STI2, erosions of oxide films into the end portion of the active region ACT1 and the end portion of the active region ACT2 occur due to a thermal treatment process, resulting in the occurrence of a phenomenon in which the area of the active region ACT1 and the area of the active region ACT2 become smaller than that of the design value. When this phenomenon occurs, for example, the width of the active region ACT1 and the width of the active region ACT2 in the gate width direction become narrower to cause a reduction of the electric current of each of the field effect transistor Q1 and the field effect transistor Q2, and the subsequent performance degradation of the field effect transistor Q1 and the field effect transistor Q2. Moreover, it is considered that the degrees of corrosion of the oxide film become different depending on the active region ACT1 and the active region ACT2 since the formation places of the active region ACT1 and the active region ACT2 are different. For example, as illustrated in FIG. 4, the width of the active region ACT1 on which the field effect transistor Q1 is formed becomes W1, while the width of the active region ACT2 on which the field effect transistor Q2 is formed becomes W2 (W1<W2). Consequently, an electric current flowing through the field effect transistor Q1 becomes smaller than an electric current flowing through the field effect transistor Q2. That is, deviations occur between the electric current flowing through the field effect transistor Q1 and the electric current flowing through the field effect transistor Q2. In this manner, between the field effect transistor Q1 and the field effect transistor Q2 that are originally supposed to have the same electric current flowing therethrough, a deviation occurs in the electric current value, thereby deteriorating the reliability of SRAM operations. Therefore, in a semiconductor device on which a plurality of field effect transistors used in circuits having the same function are formed as in the case of the above-mentioned field effect transistor Q1 and field effect transistor Q2, there is room for improvement from the viewpoint of improving the reliability of a semiconductor device and thereby improving the performance thereof.

Therefore, some ingenuities are provided to the present embodiment considering the above-mentioned room for improvement. The following description will explain technical ideas devised according to the present embodiment. In the present embodiment, the technical ideas of the present embodiment will be explained by exemplifying SOTB (Silicon On Thin Buried Oxide) transistors. However, the technical ideas of the present embodiment can be applied not only to the SOTB transistors, but also to bulk transistors in which a raised layer is formed.

<SOTB Transistor>

Field effect transistors are used for the above-mentioned SRAM and logic circuit. Normally, the field effect transistor is formed on a semiconductor substrate (silicon substrate) made of single-crystal silicon, and the field effect transistor of this type is referred to as a bulk transistor.

The field effect transistor used in the SRAM and logic circuit is constituted by a miniaturized low breakdown voltage transistor, and in recent years, from the viewpoint of improving the performance of the low breakdown voltage transistor, the low breakdown voltage transistor is sometimes formed not by a bulk transistor, but by a transistor referred to as an SOTB (Silicon On Thin Buried Oxide) transistor formed on an SOI (Silicon On Insulator) substrate.

For example, the SOI substrate has a structure in which a buried insulating layer is formed on a support substrate made of silicon, with a thin silicon layer (SOI layer) being formed on this buried insulating layer, and the field effect transistor formed on this thin silicon layer is referred to as the SOTB transistor.

In accordance with this SOTB transistor, since hardly any conductivity-type impurity is introduced into a channel region formed on the thin silicon layer, the resulting advantage is that characteristic deviations in the threshold voltage (Vth), the electric current and the like caused by impurity deviations can be reduced in comparison with those of the bulk transistor. For this reason, since the characteristic deviations are small, the SOTB transistor exerts a superior characteristic capable of carrying out a low voltage operation in a large-scale integrated circuit, in particular, in the SRAM, in comparison with that of the bulk transistor. Moreover, since the SOTB transistor forms a so-called double-gate transistor in which a support substrate located below the buried insulating layer is used as a back gate, it is superior in short-channel characteristics and it can be said that the resulting transistor is suitable for forming a miniaturized structure.

In this case, however, since the silicon layer with the SOTB transistor formed thereon is thin, the following problems might be raised (1) the resistance in the source region and the drain region becomes high to cause a reduced electric current flowing through the SOTB transistor due to the resulting parasitic resistance and (2) a silicide film might not be sufficiently formed on a surface layer of the source region or on a surface layer of the drain region. Therefore, in order to avoid these problems, the SOTB transistor is designed to have a structure in which a raised layer is formed on the source region and the drain region by using, for example, epitaxial growth.

<Basic Idea of Embodiment>

The basic idea of the present embodiment relates to a technical idea in which, for example, by focusing attention onto the above-mentioned SOTB transistor, it becomes possible to reduce electric current deviations caused among a plurality of field effect transistors used in circuits having the same function, by utilizing a raised layer formed on the SOTB transistor. More specifically, the basic idea of the present embodiment is directed as targets to a plurality of field effect transistors used in circuits having the same function, that is, the plural field effect transistors respectively formed in active regions having the same size (area). Moreover, the basic idea of the present embodiment is based upon the premise that even if active regions have the same size in the design value, erosions on the respective active regions due to the oxide film are different in the respective active regions depending on thermal treatment processes (oxidation processes) applied in the manufacturing process of the semiconductor device. By this configuration as the premise, a first field effect transistor is formed on an active region having a relatively small width and a second field effect transistor is formed on an active region having a relatively large width. In this case, the basic idea of the present embodiment resides in that the thickness of a first raised layer formed on the above-mentioned first field effect transistor is made larger than the thickness of a second raised layer formed on the above-mentioned second field effect transistor.

<Plane Configuration of Semiconductor Device in Embodiment>

The following description will explain a configuration of a semiconductor device that has embodied the basic idea of the present embodiment, and will further explain features of the semiconductor device in accordance with the present embodiment.

Figure 5:
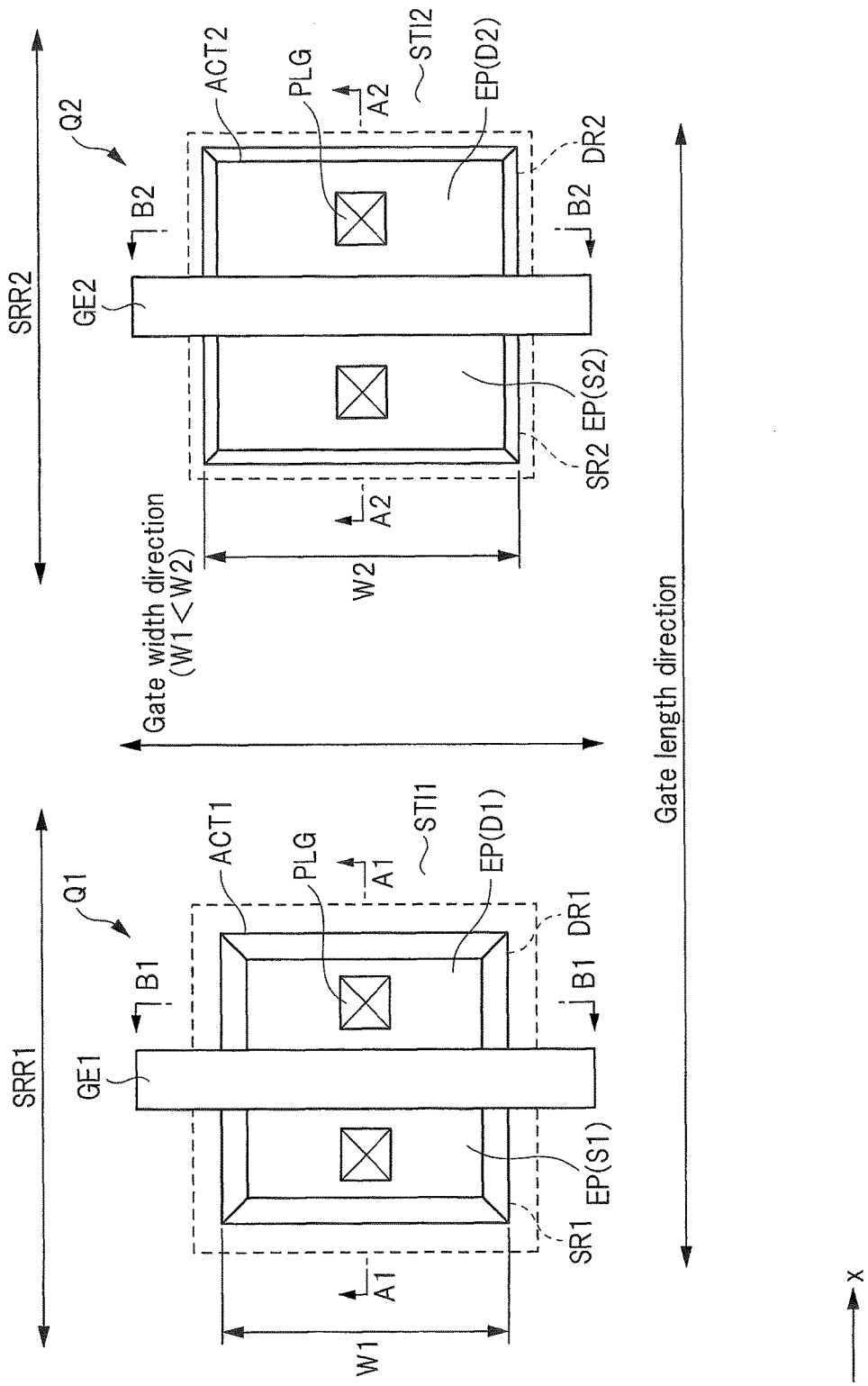
FIG. 5 is a diagram illustrating a plane configuration of the field effect transistor formed on each of the plural SRAM formation regions in the embodiment.

FIG. 5 is a diagram that shows a plane configuration of a field effect transistor Q1 made of an SOTB transistor formed on an SRAM formation region SRR1 with the SRAM formed thereon and a field effect transistor Q2 made of an SOTB transistor formed on an SRAM formation region SRR2. That is, in FIG. 5, for example, the field effect transistor Q1 and the field effect transistor Q2 forming circuits (SRAM) having the same function are illustrated.

In FIG. 5, the field effect transistor Q1 is formed on an active region ACT1 having a rectangular shape sectioned by device isolation regions STI1. That is, the field effect transistor Q1 has a gate electrode GE1 extending in the y-direction of FIG. 5 on the active region ACT1 as well as a source region SR1 and a drain region DR1 that are formed in a manner so as to sandwich the gate electrode GE1 within the active region ACT1. In this case, the width of the active region ACT1 in the y-direction is W1. Moreover, a raised source layer EP (S1) is formed on the source region SR1, and a plug PLG is formed so as to be electrically connected to the raised source layer EP (S1). In the same manner, on the drain region DR1, a raised drain layer EP (D1) is formed, and a plug PLG is formed so as to be electrically connected to the raised drain layer EP (D1). Thus, in the field effect transistor Q1, a source is formed by the source region SR1 and the raised source layer EP (S1), and a drain is formed by the drain region DR1 and the raised drain layer EP (D1).

In the same manner, in FIG. 5, the field effect transistor Q2 is formed on an active region ACT2 having a rectangular shape sectioned by device isolation regions STI2. That is, the field effect transistor Q2 has a gate electrode GE2 extending in the y-direction of FIG. 5 on the active region ACT2 as well as a source region SR2 and a drain region DR2 that are formed in a manner so as to sandwich the gate electrode GE2 within the active region ACT2. In this case, the width of the active region ACT2 in the y-direction is W2 (W2>W1). Moreover, a raised source layer EP (S2) is formed on the source region SR2, and a plug PLG is formed so as to be electrically connected to the raised source layer EP (S2). In the same manner, on the drain region DR2, a raised drain layer EP (D2) is formed, and a plug PLG is formed so as to be electrically connected to the raised drain layer EP (D2). Thus, in the field effect transistor Q2, a source is formed by the source region SR2 and the raised source layer EP (S2), and a drain is formed by the drain region DR2 and the raised drain layer EP (D2).

<Cross-Sectional Configuration of Semiconductor Device in Embodiment>

Figure 6:
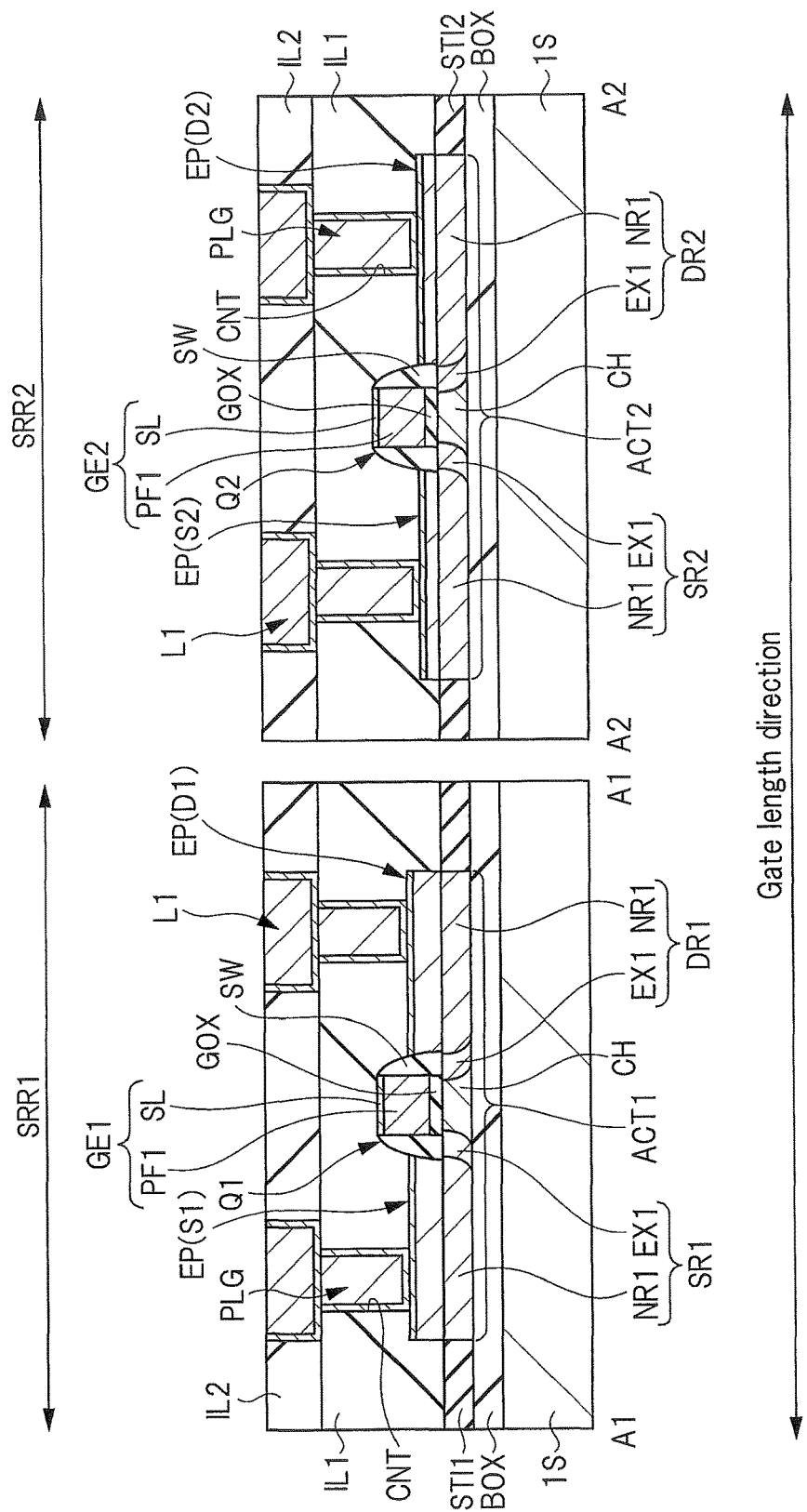
FIG. 6 is a diagram in which a cross-sectional view taken along the line A1-A1 of FIG. 5 and a cross-sectional view taken along the line A2-A2 of FIG. 5 are shown side by side.

Next, the following description will explain a cross-sectional configuration of a semiconductor device in accordance with the present embodiment. FIG. 6 is a diagram in which a cross-sectional view taken along the line A1-A1 of FIG. 5 and a cross-sectional view taken along the line A2-A2 of FIG. 5 are shown side by side. More specifically, FIG. 6 shows the cross-sectional view taken along the line A1-A1 on a plan view of a field effect transistor Q1 formed on the SRAM formation region SRR1 of FIG. 5 and the cross-sectional view taken along the line A2-A2 on a plan view of a field effect transistor Q2 formed on the SRAM formation region SRR2 of FIG. 5.

First, the following description will explain the cross-sectional configuration of the field effect transistor Q1 formed on the SRAM formation region SRR1. On the left drawing of FIG. 6, for example, a buried insulating layer BOX made of a silicon oxide film is formed on a support substrate 1S formed by a semiconductor substrate of silicon or the like, and on this buried insulating layer BOX, for example, a silicon layer made of silicon is formed. The substrate constituted by the support substrate 1S, the buried insulating layer BOX and the silicon layer forms an SOI substrate. In the silicon layer of the SOI substrate, a device isolation region STI1 is formed, and the silicon layer sectioned by the device isolation region STI1 forms an active region ACT1. On the active region ACT1, a source region SR1 and a drain region DR1 are formed so as to be spaced apart from each other, and a channel region CH is formed in a manner so as to be sandwiched by the source region SR1 and the drain region DR1. Moreover, on the channel region CH, a gate insulating film GOX made of, for example, a silicon oxide film or a high dielectric constant film having a higher dielectric constant than that of the silicon oxide film is formed, and a gate electrode GE1 is formed on the gate insulating film GOX. This gate electrode GE1 is constituted by, for example, a polysilicon film PF1 and a silicide film SL formed on the polysilicon film PF1. Next, side wall spacers SW made of, for example, silicon oxide films, are formed on side walls of the both sides of the gate electrode GE1.

The source region SR1 is composed of a low concentration impurity diffusion region EX1 aligned with the gate electrode GE1 and a high concentration impurity diffusion region NR1 that is formed on the outside of the low concentration impurity diffusion region EX1 and aligned with the side wall spacers SW. The low concentration impurity diffusion region EX1 and the high concentration impurity diffusion region NR1 are formed by an n-type semiconductor region in which an n-type impurity (donor), such as phosphorus (P), arsenic (As) or the like, is introduced, and the impurity concentration of the low concentration impurity diffusion region EX1 is made lower than the impurity concentration of the high concentration impurity diffusion region NR1.

The drain region DR1 is composed of the low concentration impurity diffusion region EX1 aligned with the gate electrode GE1 and the high concentration impurity diffusion region NR1 that is formed on the outside of the low concentration impurity diffusion region EX1 and aligned with the side wall spacers SW. The low concentration impurity diffusion region EX1 and the high concentration impurity diffusion region NR1 are formed by an n-type semiconductor region in which an n-type impurity (donor), such as phosphorus (P), arsenic (As) or the like, is introduced, and the impurity concentration of the low concentration impurity diffusion region EX1 is made lower than the impurity concentration of the high concentration impurity diffusion region NR1.

Next, the raised source layer EP (S1) is formed on the source region SR1, and the raised drain layer EP (D1) is formed on the drain region DR1. Each of the raised source layer EP (S1) and the raised drain layer EP (D1) is composed of, for example, an epitaxial layer made of silicon formed by epitaxial growth, and a silicide film SL formed on the surface layer of the epitaxial layer. The silicide film SL may be made of, for example, a nickel platinum silicide film, a nickel silicide film, a titanium silicide film, a cobalt silicide film, a platinum silicide film, or the like.

In this case, the source is formed by the source region SR1 and the raised source layer EP (S1), and the drain is formed by the drain region DR1 and the raised drain layer EP (D1).

As described above, the field effect transistor Q1 of the present embodiment is formed. Further, an interlayer insulating film IL1 made of, for example, a silicon oxide film is formed so as to cover the field effect transistor Q1, and on this interlayer insulating film IL1, a contact hole CNT that reaches the raised source layer EP (S1) or the raised drain layer EP (D1) is formed on the interlayer insulating film IL1. On the inner wall of the contact hole CNT, a titanium/titanium nitride film functioning as a barrier conductor film is formed and the contact hole CNT is further buried with a tungsten film. In other words, inside the contact hole CNT, a plug PLG made of the barrier conductor film and the tungsten film is formed. Moreover, on the interlayer insulating film IL1 in which the plug PLG is formed, an interlayer insulating film IL2 made of, for example, a silicon oxide film is formed, and on the interlayer insulating film IL2, a wiring L1 that is electrically connected to the plug PLG is formed. The wiring L1 may be formed by, for example, a copper wiring, or may be formed by an aluminum wiring.

Next, the following description will explain the cross-sectional configuration of the field effect transistor Q2 formed on the SRAM formation region SRR2. On the right drawing of FIG. 6, for example, a device isolation region STI2 is formed on a silicon layer of an SOI substrate, and the silicon layer sectioned by this device isolation region STI2 forms an active region ACT2. On the active region ACT2, a source region SR2 and a drain region DR2 are formed in a manner so as to be spaced apart from each other, and a channel region CH is formed in a manner so as to be sandwiched by the source region SR2 and the drain region DR2. Moreover, on the channel region CH, agate insulating film GOX made of, for example, a silicon oxide film or a high dielectric constant film having a higher dielectric constant than that of the silicon oxide film is formed, and a gate electrode GE2 is formed on the gate insulating film GOX. This gate electrode GE2 is constituted by, for example, a polysilicon film PF1 and a silicide film SL formed on the polysilicon film PF1. Next, side wall spacers SW made of, for example, silicon oxide films, are formed on side walls of the both sides of the gate electrode GE2.

The source region SR2 is composed of a low concentration impurity diffusion region EX1 aligned with the gate electrode GE2 and a high concentration impurity diffusion region NR1 that is formed on the outside of the low concentration impurity diffusion region EX1 and aligned with the side wall spacers SW. The low concentration impurity diffusion region EX1 and the high concentration impurity diffusion region NR1 are formed by an n-type semiconductor region in which an n-type impurity (donor), such as phosphorus (P), arsenic (As) or the like, is introduced, and the impurity concentration of the low concentration impurity diffusion region EX1 is made lower than the impurity concentration of the high concentration impurity diffusion region NR1.

The drain region DR2 is composed of the low concentration impurity diffusion region EX1 aligned with the gate electrode GE2 and the high concentration impurity diffusion region NR1 that is formed on the outside of the low concentration impurity diffusion region EX1 and aligned with the side wall spacers SW. The low concentration impurity diffusion region EX1 and the high concentration impurity diffusion region NR1 are formed by an n-type semiconductor region in which an n-type impurity (donor), such as phosphorus (P), arsenic (As) or the like, is introduced, and the impurity concentration of the low concentration impurity diffusion region EX1 is made lower than the impurity concentration of the high concentration impurity diffusion region NR1.

Next, a raised source layer EP (S2) is formed on the source region SR2, and a raised drain layer EP (D2) is formed on the drain region DR2. Each of the raised source layer EP (S2) and the raised drain layer EP (D2) is composed of, for example, an epitaxial layer made of silicon formed by epitaxial growth, and a silicide film SL formed on the surface layer of the epitaxial layer. The silicide film SL may be made of, for example, a nickel platinum silicide film, a nickel silicide film, a titanium silicide film, a cobalt silicide film, a platinum silicide film, or the like.

In this case, the source is formed by the source region SR2 and the raised source layer EP (S2), and the drain is formed by the drain region DR2 and the raised drain layer EP (D2).

As described above, the field effect transistor Q2 of the present embodiment is formed. Further, an interlayer insulating film IL1 made of, for example, a silicon oxide film is formed so as to cover the field effect transistor Q2, and on this interlayer insulating film IL1, a contact hole CNT that reaches the raised source layer EP (S2) or the raised drain layer EP (D2) s formed on the interlayer insulating film IL1. On the inner wall of the contact hole CNT, a titanium/titanium nitride film functioning as a barrier conductor film is formed and the contact hole CNT is further buried with a tungsten film. In other words, inside the contact hole CNT, a plug PLG made of the barrier conductor film and the tungsten film is formed. Moreover, on the interlayer insulating film IL1 in which the plug PLG is formed, an interlayer insulating film IL2 made of, for example, a silicon oxide film is formed, and on the interlayer insulating film IL2, a wiring L1 that is electrically connected to the plug PLG is formed. The wiring L1 may be formed by, for example, a copper wiring, or may be formed by an aluminum wiring.

Figure 7:
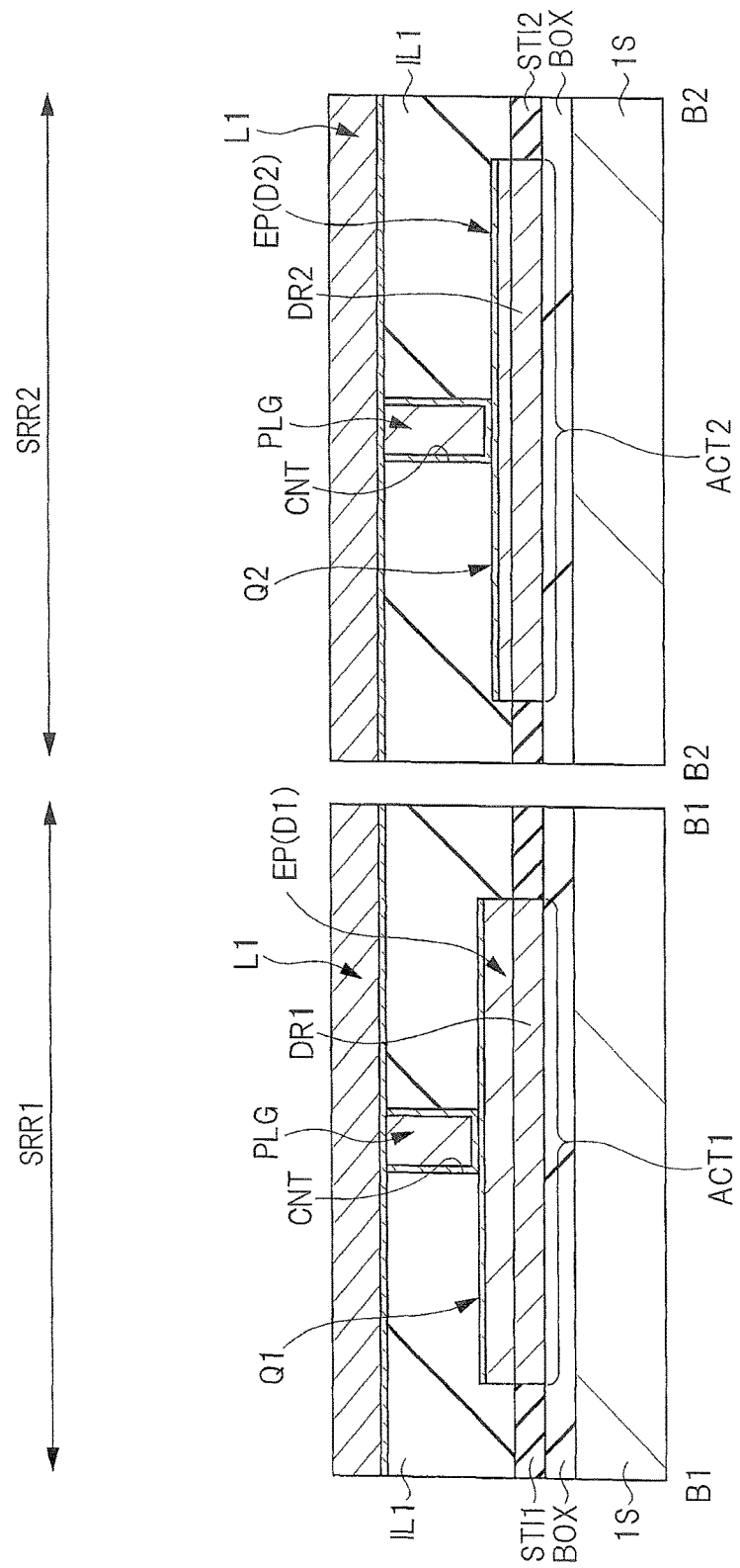
FIG. 7 is a diagram in which a cross-sectional view taken along the line B1-B1 of FIG. 5 and a cross-sectional view taken along the line B2-B2 of FIG. 5 are shown side by side.

Next, FIG. 7 is a diagram illustrating a cross-sectional view taken along the line B1-B1 of FIG. 5 and a cross-sectional view taken along the line B2-B2 of FIG. 5, which are placed side by side. More specifically, FIG. 7 shows the cross-sectional view taken along the E1-E1 line on a plan view of a field effect transistor Q1 formed on the SRAM formation region SRR1 of FIG. 5 and the cross-sectional view taken along the B2-B2 line on a plan view of a field effect transistor Q2 formed on the SRAM formation region SRR2 of FIG. 5.

First, the following description will explain the cross-sectional configuration of the field effect transistor Q1 formed on the SRAM formation region SRR1 in FIG. 7. On the left drawing of FIG. 7, for example, a device isolation region STI1 is formed in the silicon layer of the SOI substrate, and the silicon layer sectioned by the device isolation region STI1 forms an active region ACT1. On the active region ACT1, a drain region DR1 serving as an n-type semiconductor region is formed, and a raised drain layer EP (D1) is formed on the drain region DR1. Moreover, an interlayer insulating film IL1 made of, for example, a silicon oxide film, is formed in a manner so as to cover the raised drain layer EP (D1). On the interlayer insulating film IL1, a contact hole CNT that reaches the raised drain layer EP (D1) is formed. On the inner wall of the contact hole CNT, a titanium/titanium nitride film functioning as a barrier conductor film is formed and the contact hole CNT is further buried with a tungsten film. In other words, inside the contact hole CNT, the plug PLG made of the barrier conductor film and the tungsten film is formed. Moreover, on the interlayer insulating film IL1 in which the plug PLG is formed, a wiring L1 made of, for example, a copper wiring is formed.

Next, referring to FIG. 7, the following description will explain the cross-sectional configuration of the field effect transistor Q2 formed on the SRAM formation region SRR2. On the right drawing of FIG. 7, for example, a device isolation region STI2 is formed in the silicon layer of the SOI substrate, and the silicon layer sectioned by this device isolation region STI2 forms an active region ACT2. A drain region DR2 serving as an n-type semiconductor region is formed on the active region ACT2, and on the drain region DR2, a raised drain layer EP (D2) is formed. Moreover, an interlayer insulating film IL1 made of, for example, a silicon oxide film is formed so as to cover the raised drain layer EP (D2), and on the interlayer insulating film IL1, a contact hole that reaches the raised drain layer EP (D2) is formed. On the inner wall of the contact hole CNT, a titanium/titanium nitride film serving as a barrier conductor film is formed, and the contact hole CNT is further buried with a tungsten film. In other words, inside the contact hole CNT, a plug PLG made of the barrier conductor film and the tungsten film is formed. Moreover, on the interlayer insulating film IL1 in which the plug PLG is formed, a wiring L1 made of, for example, a copper wiring is formed.

<Characteristics of Present Embodiment>

In the above-described manner, the semiconductor device of the present embodiment is configured. Next, characteristics of the present embodiment will be explained. For example, as illustrated in FIG. 5 and FIG. 6, the characteristics of the present embodiment are based upon the premise that although active regions having the same size in their design value are prepared, erosions, which are caused on the respective active regions due to an oxide film by a thermal treatment process (oxidation process) applied in the manufacturing process of the semiconductor device, are different. In other words, the characteristics of the present embodiment are given on the premise that, as illustrated in FIG. 5 and FIG. 6, a semiconductor device including a field effect transistor Q1 formed on an active region ACT1 having a comparatively small width, which is sectioned by an device isolation region STI1, and a field effect transistor Q2 formed on an active region ACT2 having a comparatively large width, which is sectioned by an device isolation region STI2, is utilized. For example, in FIG. 5, the premise corresponds to a structure in which the width (W1) of the active region ACT1 in the gate width direction (y-direction) of the gate electrode GE1 is smaller than the width (W2) of the active region ACT2 in the gate width direction (y-direction) of the gate electrode GE2. Moreover, under this premise, the characteristics of the present embodiment reside in that, as illustrated in FIG. 6, the height of a raised source layer EP (S1) formed on the field effect transistor Q1 is made larger than the height of a raised source layer EP (S2) formed on the field effect transistor Q2, while the height of a raised drain layer EP (D1) formed on the field effect transistor Q1 is made larger than the height of a raised drain layer EP (D2) formed on the field effect transistor Q2.

Thus, in accordance with the present embodiment, as illustrated in FIG. 5 and FIG. 6, since the width (W1) of the active region ACT1 is comparatively small in the field effect transistor Q1, an electric current flowing through the field effect transistor Q1 becomes smaller than an electric current flowing through the field effect transistor Q2; however, since the height of the raised source layer EP (S1) and the height of the raised drain layer EP (D1) are made higher, the resistance of the source/drain becomes small. This is because when the height of the raised source layer EP (S1) and the height of the raised drain layer EP (D1) are made higher, the distance between the channel region CH and the plug PLG becomes longer, thereby enlarging the cross sectional area (cross sectional area in a direction crossing the direction in which the electric current flows) of the source/drain. In other words, the influence of the latter becomes greater than the influence of the former, and as a result, the resistance of the source/drain becomes smaller. On the other hand, in the field effect transistor Q2, although an electric current flowing through the field effect transistor Q2 becomes larger than an electric current flowing through the field effect transistor Q1 because the width (W2) of the active region ACT2 becomes relatively large, the resistance of the source/drain becomes large since the heights of the raised source layer EP (S2) and the raised drain layer EP (D2) become lower. This is because when the height of the raised source layer EP (S2) and the height of the raised drain layer EP (D2) are made lower, the distance between the channel region CH and the plug PLG becomes shorter, thereby reducing the cross sectional area (cross sectional area in a direction crossing the direction in which the electric current flows) of the source/drain. In other words, the influence of the latter becomes greater than the influence of the former, and as a result, the resistance of the source/drain becomes larger.

Consequently, in accordance with the present embodiment, although the electric current flowing through the field effect transistor Q1 is reduced in comparison with that flowing through the field effect transistor Q2 due to the small width (W1) of the active region ACT1, the reduction in the electric current can be suppressed by the reduction of the resistance achieved by increasing the height of the raised source layer EP (S1) and the height of the raised drain layer EP (D1). On the other hand, although the reduction of the electric current in the field effect transistor Q2 is smaller in comparison with that in the field effect transistor Q1 because of the large width (W2) of the active region ACT2, the reduction of the electric current is accelerated in comparison with that of the field effect transistor Q1 due to an increase of the resistance caused by lowering the height of the raised source layer EP (S2) and the height of the raised drain layer EP (D2). Therefore, in accordance with the present embodiment, by making the height of the raised source layer EP (S1) higher than the height of the raised source layer EP (S2), as well as by making the height of the raised drain layer EP (D1) higher than the height of the raised drain layer EP (D2), it becomes possible to correct the balance between the reduced amount of the electric current in the field effect transistor Q1 and the reduced amount of the electric current in the field effect transistor Q2 in an approaching direction to each other.

This means that the present embodiment makes it possible to obtain an effect for reducing electric current deviations caused between the field effect transistor Q1 and the field effect transistor Q2. Therefore, the present embodiment makes it possible to suppress the performance degradation of a semiconductor device including the field effect transistor Q1 and the field effect transistor Q2.

In this case, one of the characteristics of the present embodiment lies in that the height of the surface of the raised source layer EP (S1) is made larger than the height of the surface of the raised source layer EP (S2), with the height of the surface of the raised drain layer EP (D1) being made larger than the height of the surface of the raised drain layer EP (D2); however, "the raised layer" is not necessarily formed so as to have a fixed "height". That is, the raised source layer EP (S1), the raised source layer EP (S2), the raised drain layer EP (D1) and the raised drain layer EP (D2) are generally referred to as "the raised layers". In this case, with respect to the height of the surface of "the raised layer", for example, in FIG. 6, it is illustrated as a flat portion with a constant height; however, in an actual device configuration, it is considered that the height of "the raised layer" is not necessarily set to a constant height and that it is sometimes formed into a concave/convex shape. In the case when the height of "the raised layer" is constant, the configuration in which the height of the surface of the raised source layer EP (S1) is higher than the surface of the raised source layer EP (S2), with the height of the surface of the raised drain layer EP (D1) being higher than the surface of the raised drain layer EP (D2), can be clearly defined. On the other hand, in the case when the height of "the raised layer" is not a constant height and it is formed into a concave/convex shape, since there are deviations in "the heights" of "the raised layers", it is considered that it sometimes becomes difficult to clearly define the above-mentioned characteristic. Therefore, in the present embodiment, for example, in the case when the height of "the raised layer" is not a constant height and it is formed into a concave/convex shape, in the present specification, the height of the surface of "the raised layer" is defined as the height of the highest position of the surface of "the raised layer" having the concave/convex shape. That is, the height of the surface of the raised source layer EP (S1) refers to the height of the highest position of the surface of the raised source layer EP (S1), and the height of the surface of the raised source layer EP (S2) refers to the height of the highest position of the surface of the raised source layer EP (S2). In the same manner, the height of the surface of the raised drain layer EP (D1) refers to the height of the highest position of the surface of the raised drain layer EP (D1), and the height of the surface of the raised drain layer EP (D2) refers to the height of the highest position of the surface of the raised drain layer EP (D2). Thus, even in the case when the height of "the raised layer" is not a constant height and it is formed into a concave/convex shape, the characteristic of the present embodiment can be clearly defined.

Moreover, the above-mentioned characteristic of the present embodiment may be indicated by another expression. That is, the characteristic of the present embodiment may be indicated by a configuration in which the thickness of the raised source layer EP (S1) is made larger than the thickness of the raised source layer EP (S2), with the thickness of the raised drain layer EP (D1) being made larger than the thickness of the raised drain layer EP (D2). In this case, "the raised layer" includes a silicide film formed on the surface layer. In other words, the raised source layer EP (S1) includes the silicide film formed on the surface layer, and the raised source layer EP (S2) includes the silicide film formed on the surface layer. In the same manner, the raised drain layer EP (D1) includes the silicide film formed on the surface layer, and the raised drain layer EP (D2) includes the silicide film formed on the surface layer. With this arrangement, in a configuration in which the thickness of the raised source layer EP (S1) is made larger than the thickness of the raised source layer EP (S2), with the thickness of the raised drain layer EP (D1) being made larger than the thickness of the raised drain layer EP (D2), the thicknesses of "the raised layers" may be defined in the same manner even in the case when the thickness of the silicide film is included therein. In other words, the characteristic configuration in which the thickness of the raised source layer EP (S1) is made larger than the thickness of the raised source layer EP (S2), with the thickness of the raised drain layer EP (D1) being made larger than the thickness of the raised drain layer EP (D2), is achieved in a configuration in a stage with no silicide film being formed on the surface layer of "the raised layer", as well as in a configuration in a stage in which the silicide film has been formed on the surface layer of "the raised layer".

Moreover, for example, in the present embodiment, the field effect transistor Q1 and the field effect transistor Q2 are formed on an SOI substrate. Therefore, in the configuration in which the thickness of the raised source layer EP (S1) is made larger than the thickness of the raised source layer EP (S2), with the thickness of the raised drain layer EP (D1) being also made larger than the thickness of the raised drain layer EP (D2), the reference of the thickness can be set to, for example, the upper surface of the silicon layer of the SOI substrate. In this case, the above-mentioned characteristic of the present embodiment may be indicated by the expression that the thickness of the raised source layer EP (S1) defined based upon the upper surface of the silicon layer as a reference is made larger than the thickness of the raised source layer EP (S2) defined based upon the upper surface of the silicon layer as a reference, with the thickness of the raised drain layer EP (D1) defined based upon the upper surface of the silicon layer as a reference being also made larger than the thickness of the raised drain layer EP (D2) defined based upon the upper surface of the silicon layer as a reference.

Moreover, the reference of the thickness can be set to, for example, the upper surface of the buried insulating layer of the SOI substrate. In this case, the above-mentioned characteristic of the present embodiment may be indicated by the expression that the thickness of the raised source layer EP (S1) defined based upon the upper surface of the buried insulating layer as a reference is made larger than the thickness of the raised source layer EP (S2) defined based upon the upper surface of the buried insulating layer as a reference, with the thickness of the raised drain layer EP (D1) defined based upon the upper surface of the buried insulating layer as a reference being also made larger than the thickness of the raised drain layer EP (D2) defined based upon the upper surface of the buried insulating layer as a reference.

Additionally, for example, the field effect transistor Q1 and the field effect transistor Q2 may be prepared as bulk transistors formed on a normal semiconductor substrate, and in this case, the reference of the thickness of "the raised layer" can be set to the surface of the semiconductor substrate.

<Method for Manufacturing Semiconductor Device in Embodiment>

The semiconductor device in accordance with the present embodiment is configured as described above, and referring to drawings, the following description will explain the method of manufacturing the semiconductor device. In the method of manufacturing the semiconductor device in accordance with the present embodiment, upon achieving the above-mentioned characteristic configuration of the semiconductor device, the following characteristics are prepared. That is, by using selective epitaxial growth with the same conditions, the raised source layer EP (S1) is formed on the source region SR1 illustrated in FIG. 6, with the raised drain layer EP (D1) being formed on the drain region DR1, and the raised source layer EP (S2) is formed on the source region SR2, with the raised drain layer EP (D2) being simultaneously formed on the drain region DR2. In other words, in the method of manufacturing the semiconductor device in accordance with the present embodiment, by utilizing a novel phenomenon in which, with respect to the thickness of "the raised layer" to be formed by the selective epitaxial growth, under a specific deposition condition, the thickness of "the raised layer" to be formed on the active region becomes thicker as the size (area) of the active region forming the base layer becomes narrower, the above-mentioned characteristic configuration of the semiconductor device is achieved.

Figure 8:
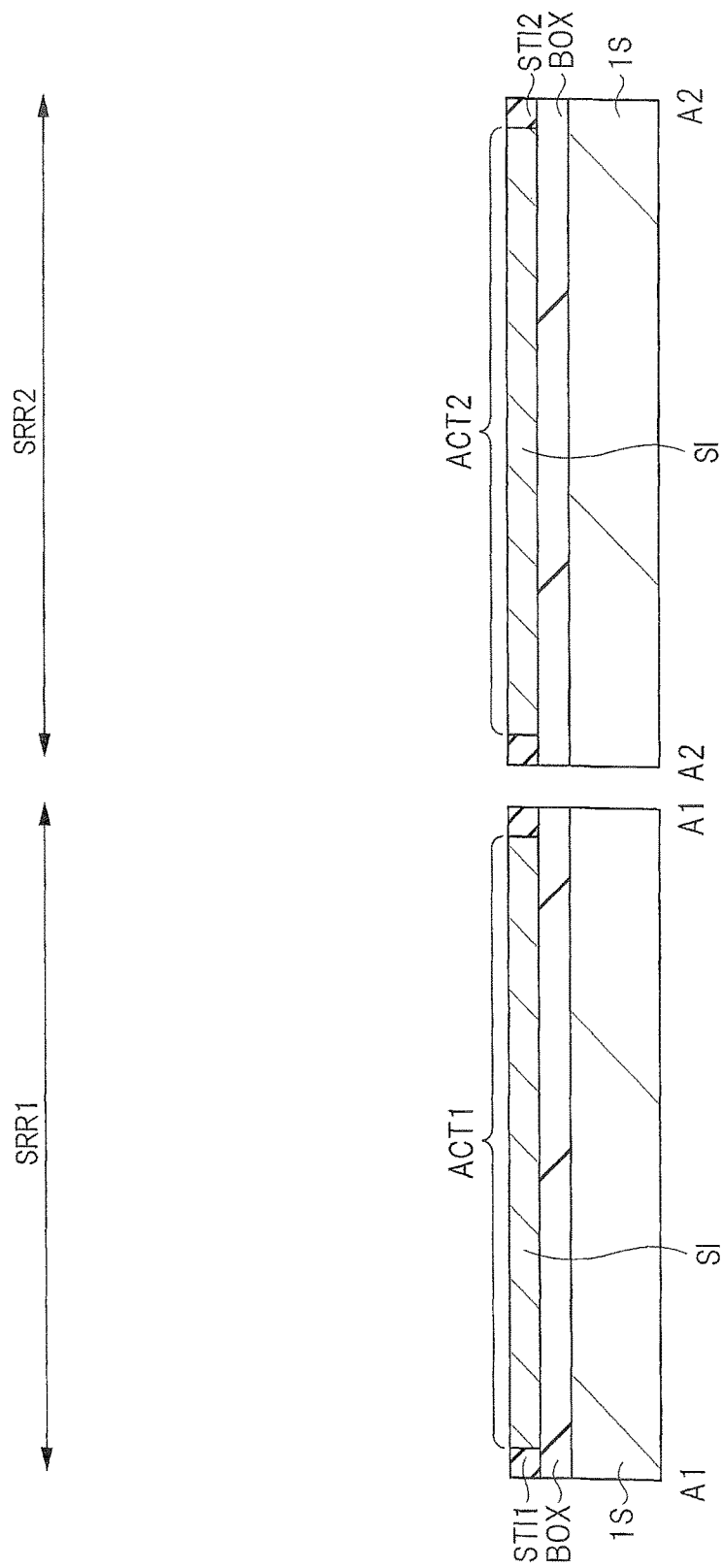
FIG. 8 is a cross-sectional view illustrating a manufacturing process of a semiconductor device in accordance with the embodiment.

The following description will explain the method of manufacturing the semiconductor device in accordance with the present embodiment in detail. First, as illustrated in FIG. 8, an SOI substrate, which is composed of a support substrate 1S made of silicon, a buried insulating layer BOX formed on the support substrate 1S and a silicon layer SI formed on the buried insulating layer BOX, is prepared. In this case, the SOI substrate is formed into a semiconductor wafer state virtually having a disc shape. Moreover, a device isolation region used in separating elements from each other is formed in the silicon layer SI of the SOI substrate. This device isolation region is formed so as to prevent the elements from intervening with one another. More specifically, on the SRAM formation region SRR1, the device isolation region STI1 is formed, and on the SRAM formation region SRR2, the device isolation region STI2 is formed. These device isolation region STI1 and device isolation region STI2 may be formed by using, for example, a LOCOS (Local Oxidation of Silicon) method or a STI (Shallow Trench Isolation) method. For example, in the STI method, the device isolation region STI1 and device isolation region STI2 are formed in the following manner. That is, in the silicon layer SI of the SOI substrate, device isolation trenches are formed by using a photolithography technique and an etching technique. Then, a silicon oxide film is formed on the SOI substrate in a manner so as to bury the device isolation trenches, and thereafter, an unnecessary silicon oxide film formed on the SOI substrate is removed by a chemical mechanical polishing method (CMP method). Thus, the device isolation region STI1 and device isolation region STI2 in which the silicon oxide film is buried only the inside of the device isolation trench can be formed. With this structure, in the SRAM formation region SRR1, the active region ACT1 sectioned by the device isolation region STI1 is formed in the silicon layer SI of the SOI substrate, and in the SRAM formation region SRR2, the active region ACT2 sectioned by the device isolation region STI2 is formed in the silicon layer SI of the SOI substrate. In this case, the size (area) of the active region ACT1 formed on the SRAM formation region SRR1 and the size (area) of the active region ACT2 formed on the SRAM formation region SRR2 are the same.

Figure 9:
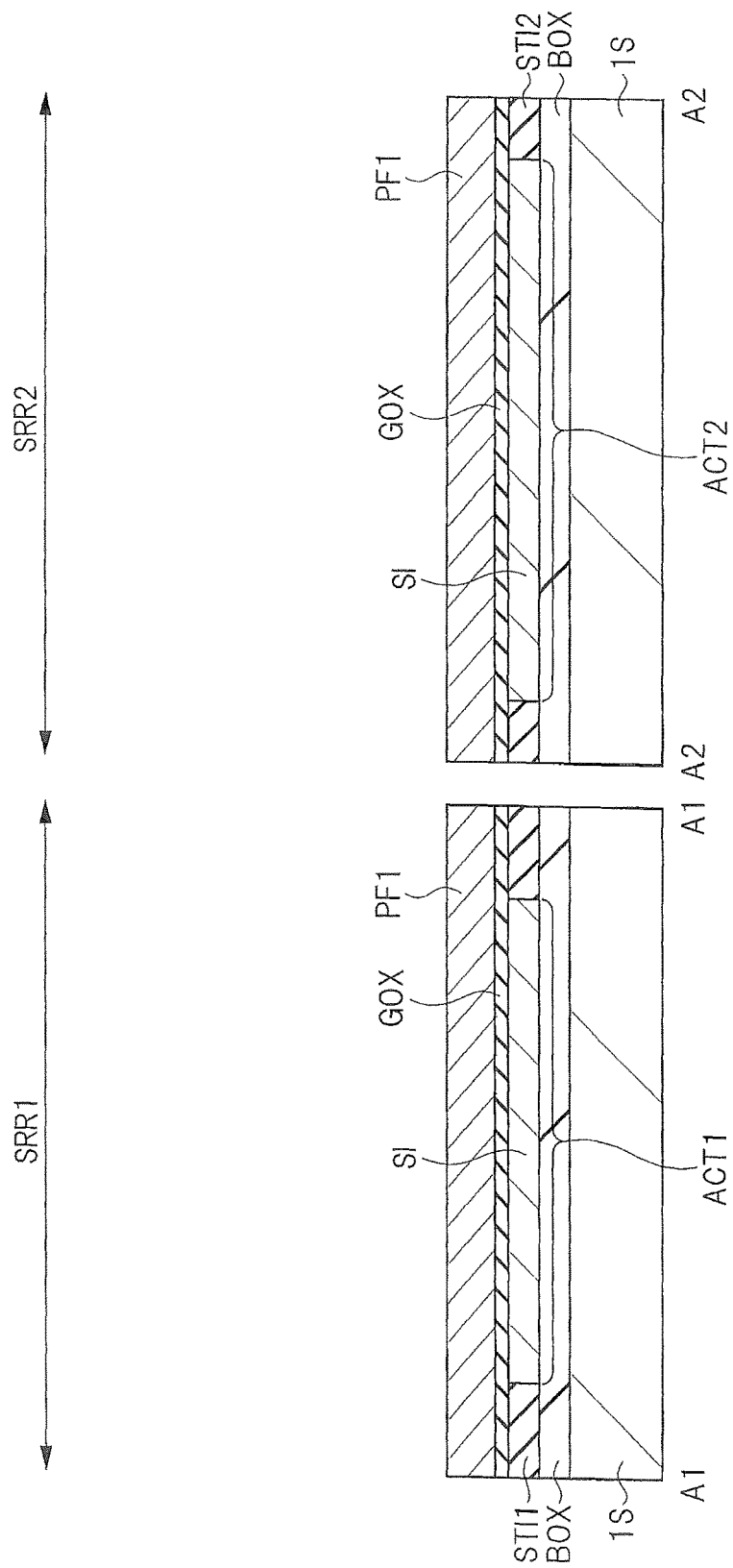
FIG. 9 is a cross-sectional view illustrating a manufacturing process of a semiconductor device, which follows FIG. 8.

Next, as illustrated in FIG. 9, a gate insulating film GOX is formed on the silicon layer SI of the SOI substrate. The gate insulating film GOX, which is made of, for example, a silicon oxide film, can be formed by using, for example, a thermal oxidation method. However, the gate insulating film GOX is not necessarily limited by the silicon oxide film, and may be modified in various ways, and for example, the gate insulating film GOX may be prepared, for example, as a silicon oxynitride film (SiON). In other words, a configuration may be used in which nitrogen is introduced into the gate insulating film GOX. The silicon oxynitride film is highly effective in suppressing the generation of interface levels in the film as well as in reducing electron traps, in comparison with the silicon oxide film. Therefore, it is possible to improve the hot carrier resistance of the gate insulating film GOX and also to improve the insulation resistance thereof. Moreover, the silicon oxynitride film makes impurities hardly penetrate therethrough in comparison with the silicon oxide film. For this reason, by using the silicon oxynitride film as the gate insulating film GOX, it becomes possible to suppress variations in threshold voltage due to diffusion of impurities in the gate electrode toward the silicon layer SI side. In an attempt to form the silicon oxynitride film, for example, an SOI substrate can be subjected to a thermal treatment in an atmosphere containing nitrogen, such as NO, $NO_2$, $NH_3$ or the like. Moreover, after forming the gate insulating film GOX made of a silicon oxide film on the silicon layer SI of the SOI substrate, the SOI substrate may be subjected to a thermal treatment in an atmosphere containing nitrogen so that nitrogen is introduced into the gate insulating film GOX; thus, the same effect can be obtained also in this method.

Furthermore, the gate insulating film GOX may be formed by using, for example, a high dielectric constant film having a dielectric constant higher than that of the silicon oxide film. As the high dielectric constant film having a dielectric constant higher than that of the silicon nitride film, for example, a hafnium oxide film ($HfO_2$ film), which is one of hafnium oxides, may be used. Moreover, a HfAlO film, which is formed by adding aluminum to the hafnium oxide film, may also be used. In place of the hafnium oxide film, another hafnium-based insulating film, such as a hafnium aluminate film, HfON film (hafnium oxynitride film), HfSiO film (hafnium silicate film), HfSiON film (hafnium silicon oxynitride film), HfAlO film, or the like, may be used. In addition, still another hafnium-based insulating film, which is formed by adding an oxide, such as tantalum oxide, niobium oxide, titanium oxide, zirconium oxide, lanthanum oxide, yttrium oxide, or the like, to each of these hafnium-based insulating films, may be used. Since the hafnium-based insulating film has a dielectric constant higher than that of the silicon oxide film or the silicon oxynitride film, in the same manner as in the hafnium oxide film, the same effect as in the case of using the hafnium oxide film can be obtained.

In this case, on the SRAM formation region SRR1 and the SRAM formation region SRR2 illustrated in FIG. 9, a low breakdown voltage transistor is formed; however, an I/O region is located in another region of the SOI substrate, and in this I/O region, a high breakdown voltage transistor having a breakdown voltage higher than that of the low breakdown voltage transistor is formed. At this time, the film thickness of the gate insulating film GOX of the high breakdown voltage transistor is made larger than the film thickness of the gate insulating film GOX of the low breakdown voltage transistor so as to maintain its breakdown voltage. Moreover, the formation of the gate insulating film GOX is carried out by an oxidation process (thermal treatment process) typically represented by, for example, a thermal oxidation method. For this reason, in the manufacturing process of a semiconductor device including both of the low breakdown voltage transistor and the high breakdown voltage transistor, not only the gate insulating film GOX of the low breakdown voltage transistor having a thin film thickness, but also the gate insulating film GOX of the high breakdown voltage transistor having a thick film thickness needs to be formed, with the result that the number of oxidation processes increases.

As a result, in the active region ACT1 sectioned by the device isolation region STI1, corrosion of the oxide film from the border with the device isolation region STI1 toward the end portion of the active region ACT1 tends to easily occur due to the above-mentioned increase of the oxidation processes, causing a phenomenon of a reduced area (size) of the active region ACT1. In the same manner, in the active region ACT2 sectioned by the device isolation region STI2, corrosion of the oxide film from the border with the device isolation region STI2 toward the end portion of the active region ACT2 tends to easily occur due to the above-mentioned increase of the oxidation processes, causing a phenomenon of a reduced area (size) of the active region ACT2. In this case, since the corrosion of the oxide film is considered to deviate depending on places, for example, FIG. 9 is illustrated in such a manner that the size of the active region ACT1 formed on the SRAM formation region SRR1 becomes smaller than the size of the active region ACT2 formed on the SRAM formation region SRR2. In other words, the addition of the oxidation process for forming the gate insulating film GOX of the high breakdown voltage transistor causes a deviation between the size of the active region ACT1 formed on the SRAM formation region SRR1 and the size of the active region ACT2 formed on the SRAM formation region SRR2.

Thereafter, a polysilicon film PF1 is formed on the gate insulating film GOX. The polysilicon film PF1 may be formed by using, for example, a CVD method. Thereafter, by using a photolithography technique and an ion implantation method, an n-type impurity, such as phosphorus, arsenic or the like, is introduced into the polysilicon film PF1.

Figure 10:
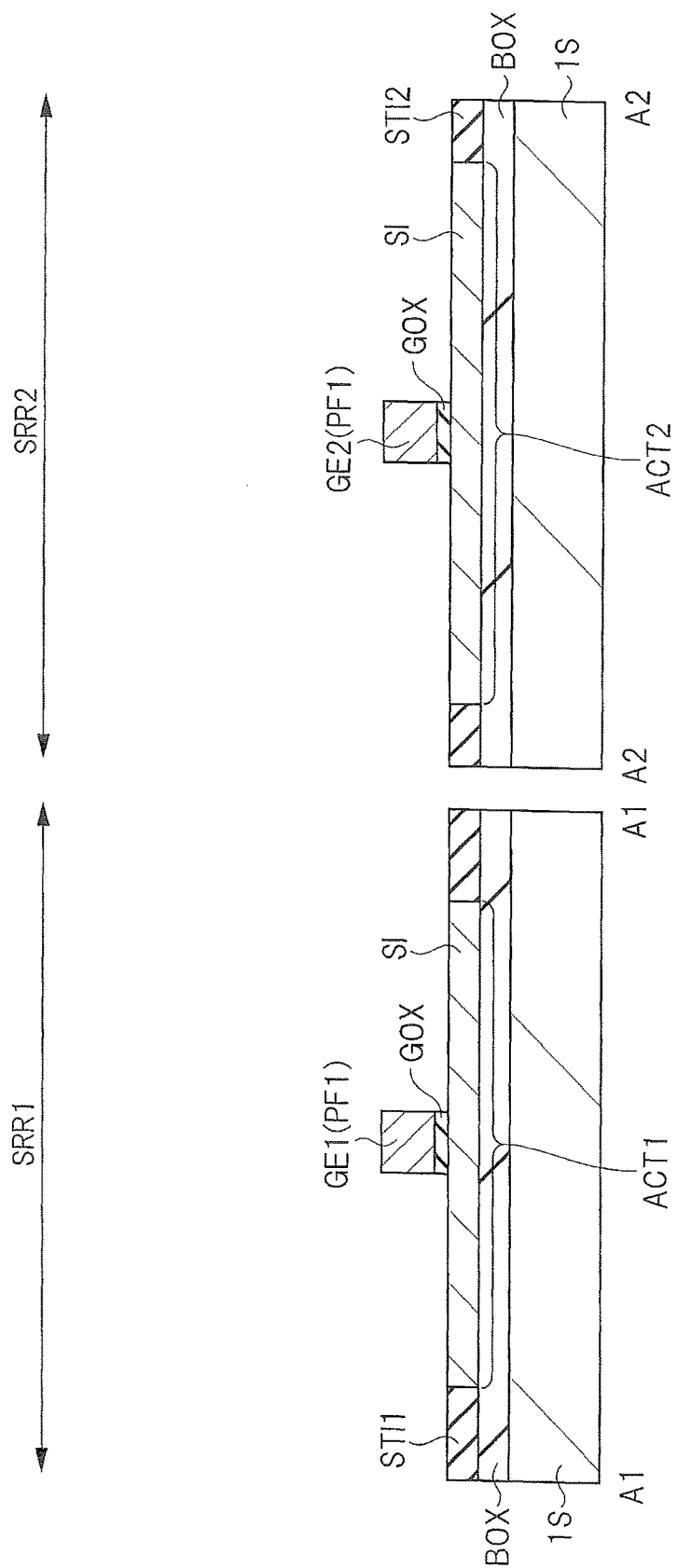
FIG. 10 is a cross-sectional view illustrating a manufacturing process of the semiconductor device continued from FIG. 9.

Moreover, as illustrated in FIG. 10, by processing the polysilicon film PF1 by the use of a photolithography technique and an etching technique, a gate electrode GE1 is formed on the SRAM formation region SRR1, and a gate electrode GE2 is formed on the SRAM formation region SRR2. In this case, an n-type impurity has been introduced into the polysilicon film PF1 forming the gate electrode GE1 and the gate electrode GE2. For this reason, since the work function value of the gate electrode GE1 and the work function value of the gate electrode GE2 can be set to a value in the vicinity of the conduction band (4.15 eV) of silicon, it is possible to reduce the threshold voltage of the n-channel type field effect transistor.

Figure 11:
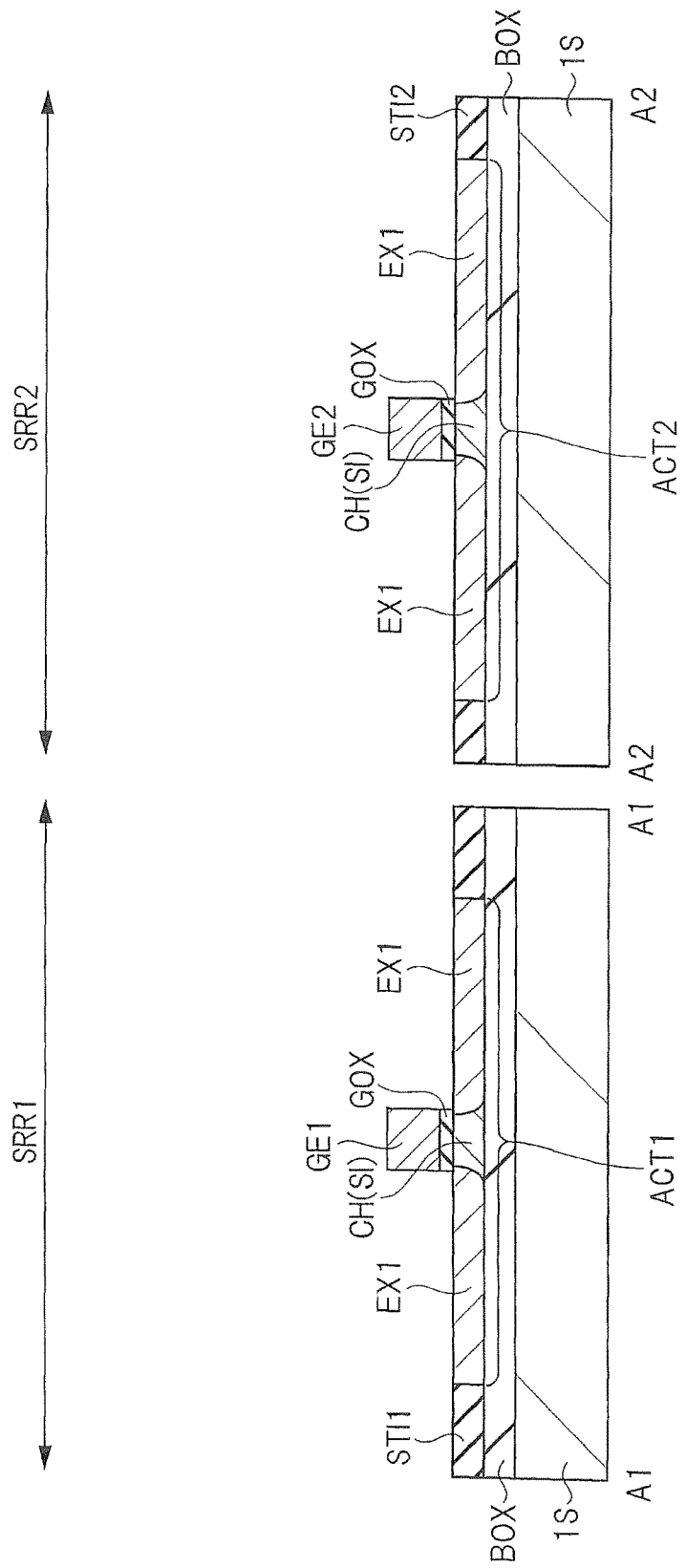
FIG. 11 is a cross-sectional view illustrating a manufacturing process of the semiconductor device continued from FIG. 10.

Next, as illustrated in FIG. 11, by using the photolithography technique and the ion implantation method, a shallow low concentration impurity diffusion region EX1, which is aligned with the gate electrode GE1, is formed on the SRAM formation region SRR1, and a shallow low concentration impurity diffusion region EX1, which is aligned with the gate electrode GE2, is formed on the SRAM formation region SRR2. The shallow low concentration impurity diffusion region EX1 is an n-type semiconductor region. Moreover, as illustrated in FIG. 11, a region, which is sandwiched between these paired shallow low concentration impurity diffusion regions EX1 spaced apart from each other, forms a channel region CH.

Figure 12:
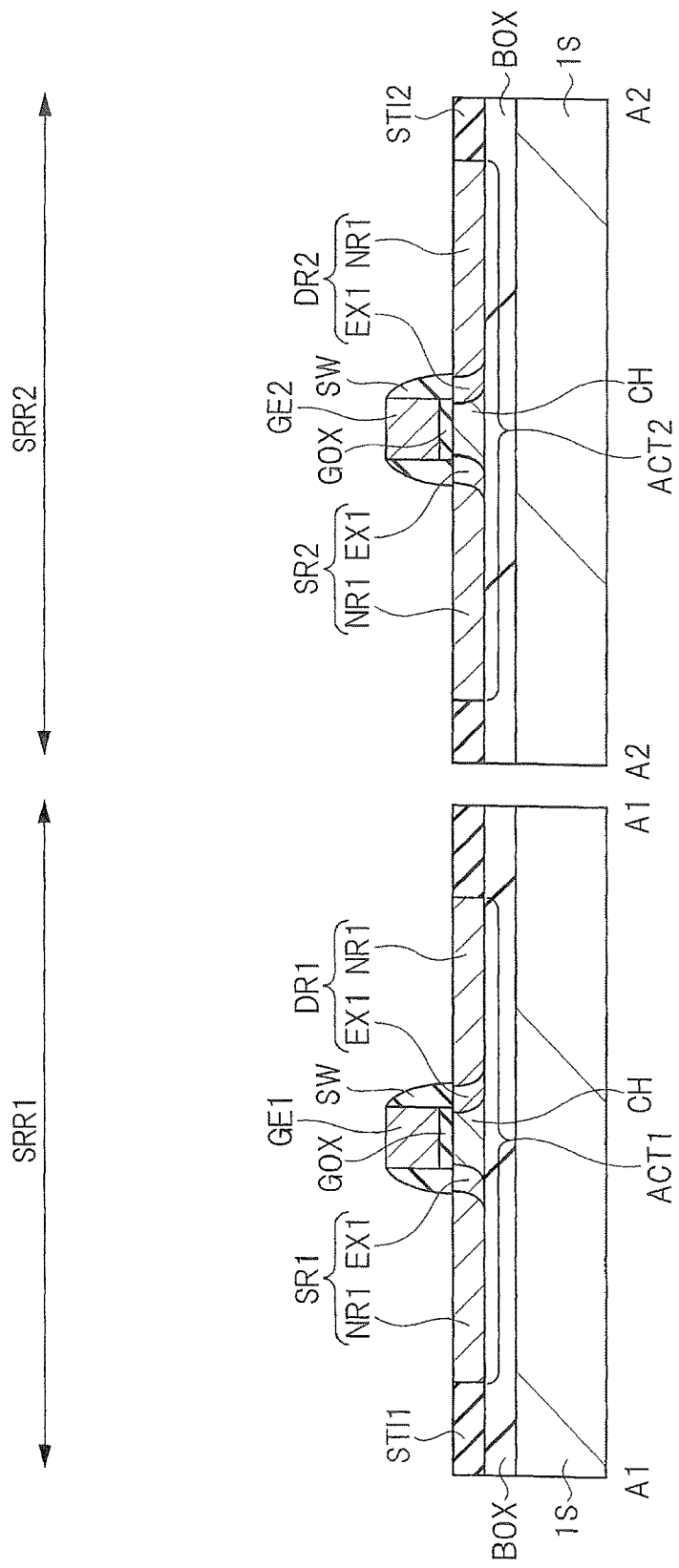
FIG. 12 is a cross-sectional view illustrating a manufacturing process of the semiconductor device continued from FIG. 11.

Next, as illustrated in FIG. 12, a silicon oxide film is formed on the SOI substrate. The silicon oxide film may be formed by using, for example, a CVD method. Moreover, by carrying out an anisotropic etching process on the silicon oxide film, sidewall spacers SW are formed on side walls on the both sides of the gate electrode GE1 in the SRAM formation region SRR1, and sidewall spacers SW are also formed on side walls on the both sides of the gate electrode GE2 in the SRAM formation region SRR2. The sidewall spacers SW are formed by using, for example, a single-layer film of a silicon oxide film; however, not limited by this, they may be formed by using a silicon nitride film or a silicon oxynitride film. Moreover, sidewall spacers SW, which are made of a laminated film formed by combining any of the silicon nitride film, silicon oxide film and silicon oxynitride film, may be formed.

By using the photolithography technique and ion implantation method, deep high concentration impurity diffusion regions NR1, which are aligned with the sidewall spacers SW, are formed on the respective SRAM formation region SRR1 and SRAM formation region SRR2. The deep high concentration impurity diffusion regions NR1 are n-type semiconductor regions. In the SRAM formation region SRR1, a source region SR1 is formed by the deep high concentration impurity diffusion region NR1 and the shallow low concentration impurity diffusion region EX1. Moreover, in the SRAM formation region SRR1, a drain region DR1 is formed by the deep high concentration impurity diffusion region NR1 and the shallow low concentration impurity diffusion region EX1. In the same manner, in the SRAM formation region SRR2, a source region SR2 is formed by the deep high concentration impurity diffusion region NR1 and the shallow low concentration impurity diffusion region EX1. Moreover, in the SRAM formation region SRR2 also, a drain region DR2 is formed by the deep high concentration impurity diffusion region NR1 and the shallow low concentration impurity diffusion region EX1.

In this manner, by forming the source region SR1 and the drain region DR1 by the use of the shallow low concentration impurity diffusion region EX1 and the deep high concentration impurity diffusion region NR1, the source region SR1 and the drain region DR1 can be formed into an LDD (Lightly Doped Drain) structure. In the same manner, by forming the source region SR2 and the drain region DR2 by the use of the shallow low concentration impurity diffusion region EX1 and the deep high concentration impurity diffusion region NR1, the source region SR2 and the drain region DR2 can be formed into the LDD structure. After forming the deep high concentration impurity diffusion region NR1 as described above, a thermal treatment process at about 1000° C. is carried out on the SOI substrate. Thus, the introduced impurity can be activated.

Figure 13:
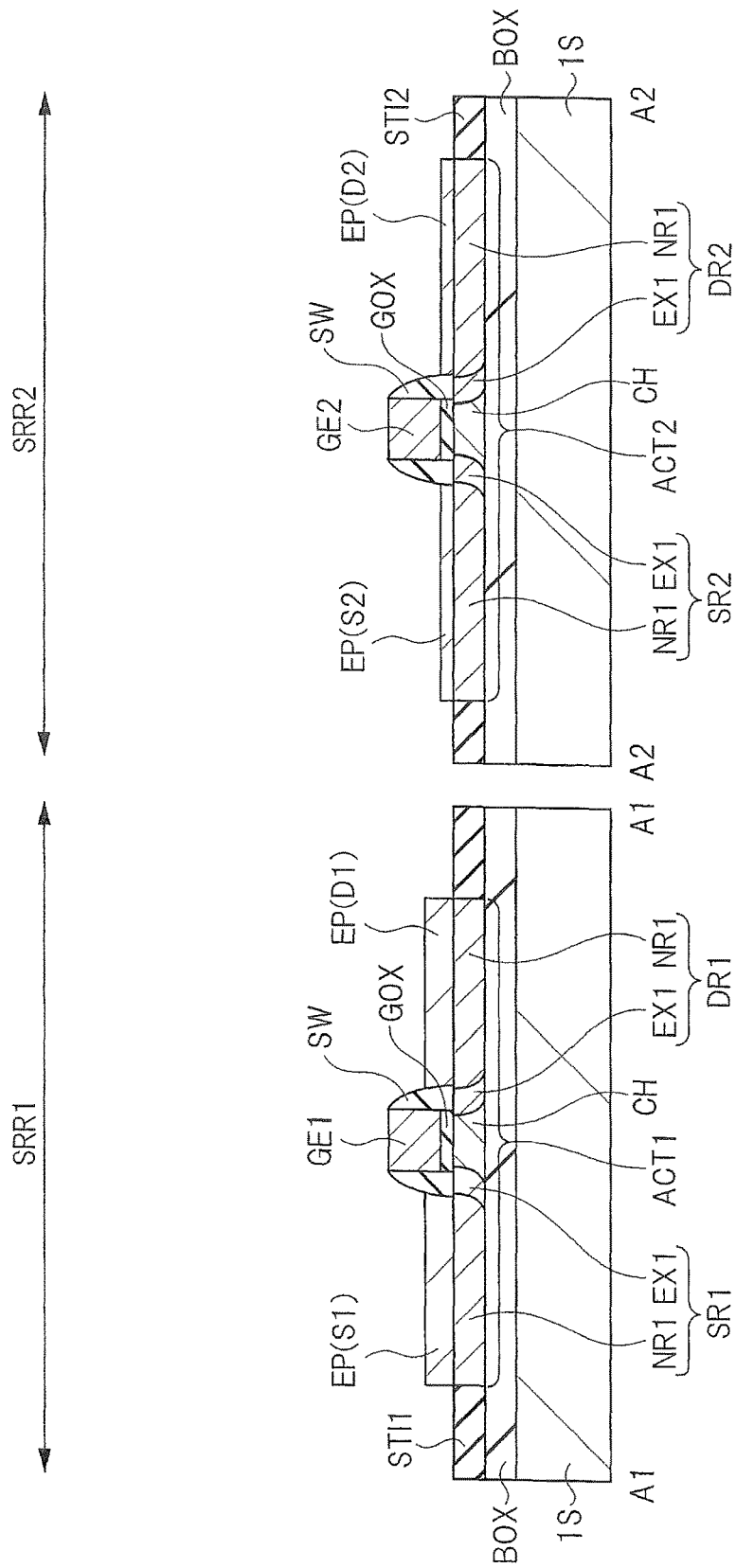
FIG. 13 is a cross-sectional view illustrating a manufacturing process of the semiconductor device continued from FIG. 12.

Next, as illustrated in FIG. 13, by using selective epitaxial growth under the same condition containing dichlorosilane and hydrogen chloride in its source gas, the raised source layer EP (S1) is formed on the source region SR1 and the raised drain layer EP (D1) is formed on the drain region DR1, in the SRAM formation region SRR1. Simultaneously, in the SRAM formation region SRR2, the raised source layer EP (S2) is formed on the source region SR2, and the raised drain layer EP (D2) is formed on the drain region DR2. At this time, in the manufacturing process of a semiconductor device in the present embodiment, a novel phenomenon occurs in which as the size (area) of the active region forming a base layer becomes narrower, the thickness of "the raised layer" to be formed on the active region becomes thicker. In other words, in the present embodiment, the size of the active region ACT1 formed on the SRAM formation region SRR1 is smaller than the size of the active region ACT2 formed on the SRAM formation region SRR2. For this reason, in accordance with the present embodiment, the height of the raised source layer EP (S1) becomes higher than the height of the raised source layer EP (S2), and the height of the raised drain layer EP (D1) also becomes higher than the height of the raised drain layer EP (D2).

The following explanation will give an estimation about the mechanism that causes the above-mentioned novel phenomenon. In the selective epitaxial growth in the present embodiment, a source gas containing dichlorosilane and hydrogen chloride is used. In this case, dichlorosilane functions as a deposition material for silicon, while hydrogen chloride functions as an etching material. That is, in the selective epitaxial growth used in the present embodiment, by depositing silicon, with one portion thereof being simultaneously etched, a film having a superior coverage is formed.

In this case, by using the above-mentioned selective epitaxial growth, an attempt is made to deposit silicon on the active region ACT1 having a relatively small size (area) and the active region ACT2 having a relatively large size (area). For example, suppose that the same amount of a source gas is respectively supplied to the active region ACT1 and the active region ACT2. In this case, in the active region ACT1 having the small size, the amount of the source gas per unit area becomes greater than that in the active region ACT2 having the large size. This means that the deposition amount of silicon derived from dichlorosilane becomes greater in the active region ACT1 having the small size in comparison with the active region ACT2 having the large size. Simultaneously, the etching amount of silicon derived from hydrogen chloride also becomes greater in the active region ACT1 having the small size in comparison with the active region ACT2 having the large size. In other words, the deposition rate derived from dichlorosilane and the etching rate derived from hydrogen chloride exert a size dependency in that as the size of the active region becomes larger, those rates become smaller. That is, the size dependency of the deposition rate relative to the active region size derived from dichlorosilane is such a size dependency that as the size of the active region becomes larger, the deposition rate becomes smaller. In the same manner, the size dependency of the etching rate relative to the active region size derived from hydrogen chloride is such a size dependency that as the size of the active region becomes larger, the etching rate becomes smaller.

Figure 14:
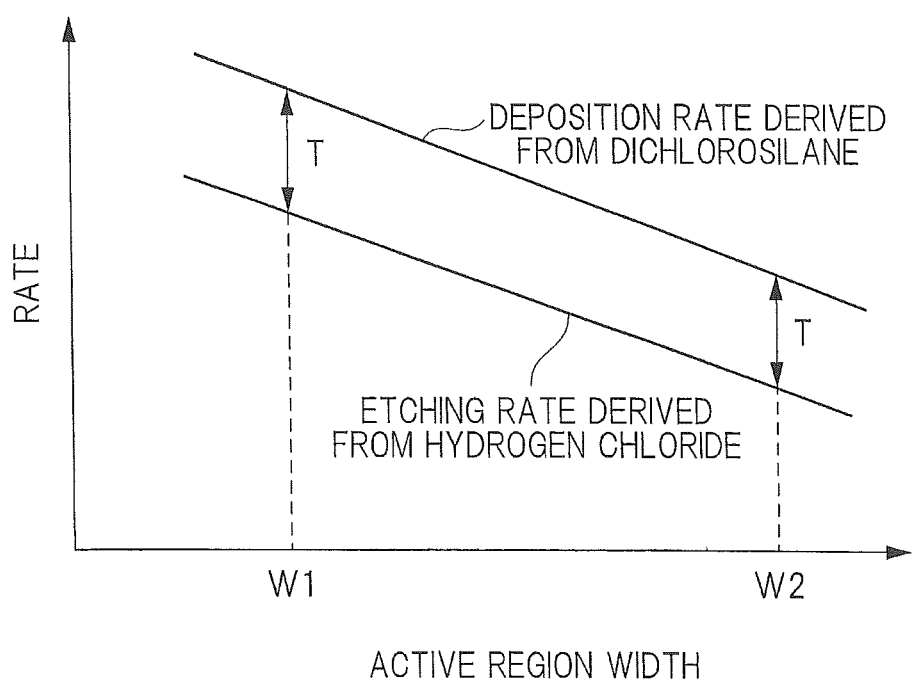
FIG. 14 is a graph that shows an example in which the size dependency of a film formation rate derived from dichlorosilane and the size dependency of an etching rate derived from hydrogen chloride are equal to each other.

At this time, as illustrated in FIG. 14, supposing that the size dependency of the deposition rate derived from dichlorosilane and the size dependency of the etching rate derived from hydrogen chloride are equal to each other, a deposition film thickness (T) represented by a difference between the deposition rate and the etching rate at the time of the active region width (W1) and a deposition film thickness (T) represented by a difference between the deposition rate and the etching rate at the time of the active region width (W2) becomes equal to each other, for example, even if both of the deposition rate and the etching rate have the size dependency.

Figure 15:
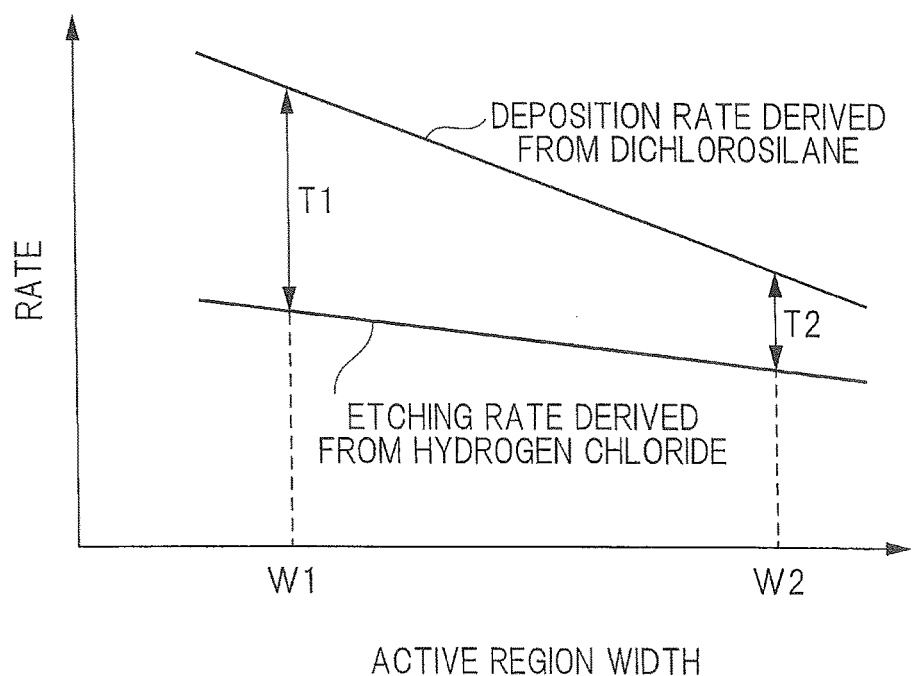
FIG. 15 is a graph that shows an example in which the size dependency of a film formation rate derived from dichlorosilane is greater than the size dependency of an etching rate derived from hydrogen chloride.

Examinations of the present inventors carried out on this point have revealed that since dichlorosilane is consumed as the deposition material, its size dependency is strong, while since hydrogen chloride is not consumed as the material and since the same hydrogen chloride is considered to be reused for the etching many times, it is hardly consumed so that its size dependency is considered to be weak. From this fact, it is considered that under a specific deposition condition, a phenomenon becomes apparent in which the size dependency of the deposition rate relative to the active region size derived from dichlorosilane becomes greater than the size dependency of the etching rate relative to the active region size derived from hydrogen chloride. In this case, as illustrated in FIG. 15, the deposition film thickness (T1) represented by a difference between the deposition rate and the etching rate at the time of the active region width (W1) becomes greater than the deposition film thickness (T2) represented by a difference between the deposition rate and the etching rate at the time of the active region width (W2). Therefore, in accordance with a deposition condition in which the size dependency of the deposition rate relative to the active region size derived from dichlorosilane becomes greater than the size dependency of the etching rate relative to the active region size derived from hydrogen chloride, it becomes possible to make the thickness of "the raised layer" to be formed on the active region thicker, as the size (area) of the active region forming the base layer becomes narrower.

As specific deposition conditions, for example, a selective epitaxial growth process using a source gas containing dichlorosilane and hydrogen chloride is carried out at a heating temperature of 650° C. or more to 900° C. or less under a pressure of 133.3 Pa (1 Torr) or more to 50×133.3 Pa (50 Torr) or less. More preferably, this process is carried out at a heating temperature of 700° C. or more to 850° C. or less under a pressure of 10×133.3 Pa (10 Torr).

Figure 16:
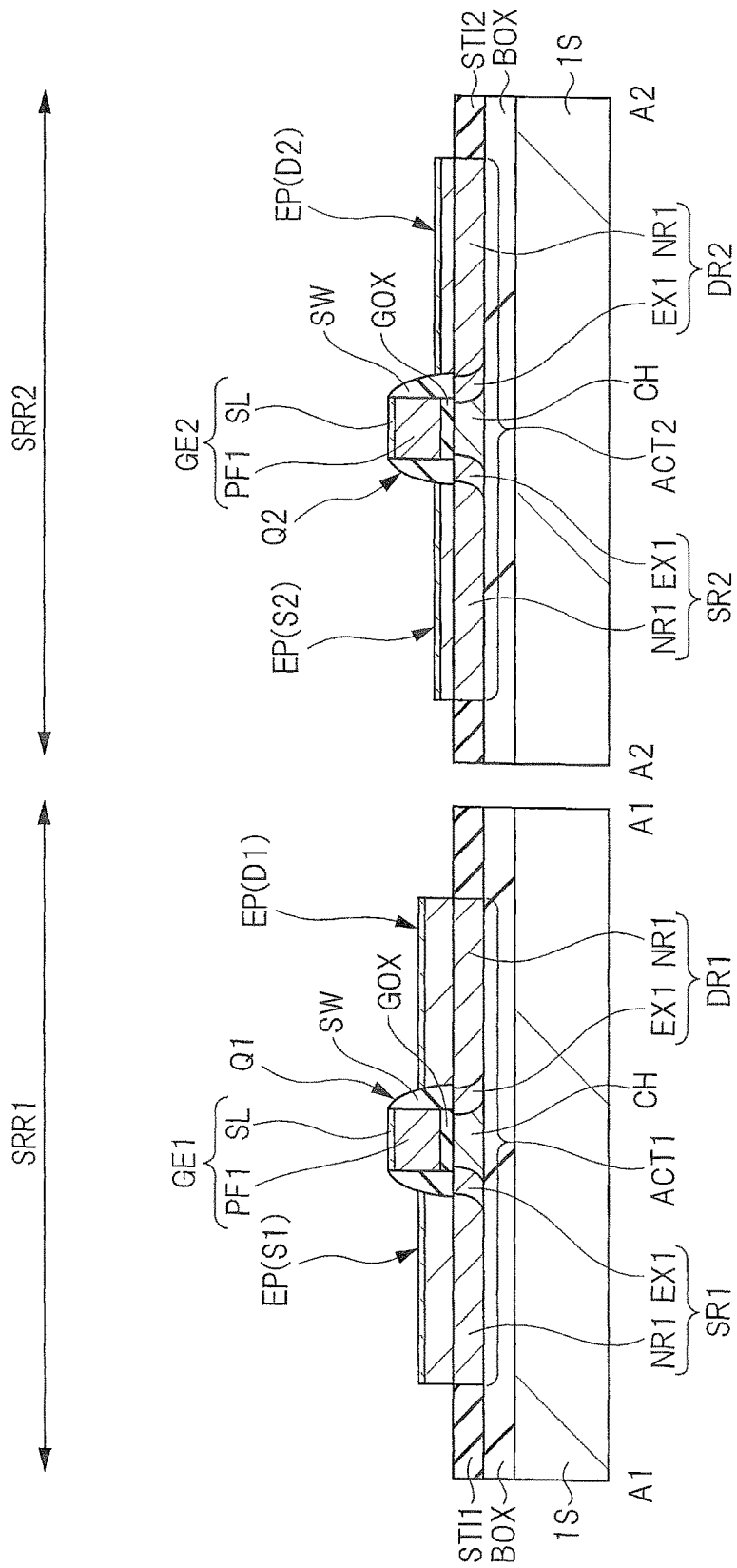
FIG. 16 is a cross-sectional view illustrating a manufacturing process of the semiconductor device continued from FIG. 13.

Thereafter, as illustrated in FIG. 16, a cobalt film is formed on the SOI substrate. At this time, in the SRAM formation region SRR1, the cobalt film is formed so as to be directly made in contact with the gate electrode GE1, and in the SRAM formation region SRR2, the cobalt film is formed so as to be directly made in contact with the gate electrode GE2. Moreover, in both of the SRAM formation region SRR1 and the SRAM formation region SRR2, the cobalt film is directly made in contact with the deep high concentration impurity diffusion region NR1. The cobalt film may be formed by using, for example, a sputtering method. After forming the cobalt film, in the SRAM formation region SRR1, by carrying out a thermal treatment on the SOI substrate, the polysilicon film PF1 forming the gate electrode GE1 is allowed to react with the cobalt film so that a silicide film SL made of a cobalt silicide film is formed. In the same manner, in the SRAM formation region SRR2, the polysilicon film PF1 forming the gate electrode GE2 is allowed to react with the cobalt film so that a silicide film SL made of a cobalt silicide film is formed. Thus, each of the gate electrode GE1 and the gate electrode GE2 is formed into a laminated layer structure of the polysilicon film PF1 and the silicide film SL. The silicide film SL is formed so as to reduce the resistances of the gate electrode GE1 and the gate electrode GE2. In the same manner, in each of the SRAM formation region SRR1 and the SRAM formation region SRR2 also, by using the above-mentioned thermal treatment, silicon and the cobalt film are reacted with each other to form a silicide film SL made of a cobalt silicide film on the surface of the deep high concentration impurity diffusion region NR1. For this reason, in the SRAM formation region SRR1, it is possible to reduce resistance in the source region SR1 and the drain region DR1, and in the SRAM formation region SRR2, it is possible to reduce resistance in the source region SR2 and the drain region DR2. Moreover, the unreacted cobalt film is removed from the SOI substrate.

Additionally, in the present embodiment, the silicide film SL made of the cobalt silicide film is formed; however, for example, in place of the cobalt silicide film, a nickel silicide film, a titanium silicide film or a platinum silicide film may be used for forming the silicide film SL.

Figure 17:
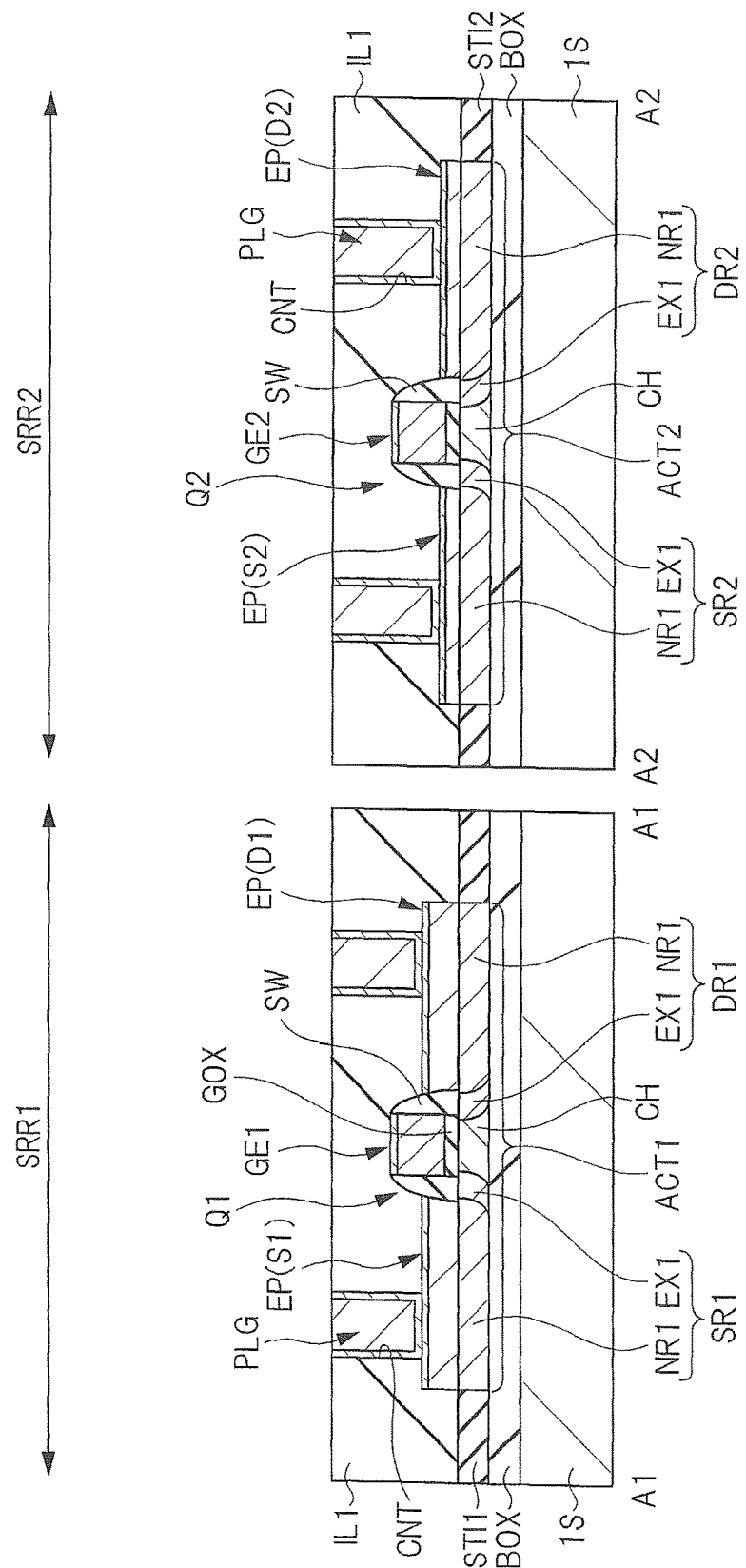
FIG. 17 is a cross-sectional view illustrating a manufacturing process of the semiconductor device continued from FIG. 16.

As described above, in accordance with the present embodiment, the field effect transistor Q1 can be produced on the SRAM formation region SRR1, and the field effect transistor Q2 can also be produced on the SRAM formation region SRR2. Thereafter, as illustrated in FIG. 17, on the SOI substrate on which the field effect transistor Q1 and the field effect transistor Q2 have been formed, an interlayer insulating film IL1 made of, for example, a silicon oxide film is formed.

Next, by using a photolithography technique and an etching technique, in the SRAM formation region SRR1, by penetrating the interlayer insulating film IL1, a contact hole CNT that reaches the source region SR1 or the drain region DR1 is formed and in the SRAM formation region SRR2, a contact hole CNT that reaches the source region SR2 or the drain region DR2 is formed.

Moreover, on the interlayer insulating film IL1 including the bottom surface and the inner wall of the contact hole CNT, a titanium/titanium nitride film is formed. The titanium/titanium nitride film, which is composed of laminated films of a titanium film and a titanium nitride film, can be formed by using, for example, a sputtering method. The titanium/titanium nitride film has a so-called barrier characteristic by which, for example, tungsten, which is a material for a film to be buried into the contact hole CNT in a succeeding process, is prevented from diffusing into silicon.

Next, a tungsten film is formed on the entire surface of the main surface of the SOI substrate in a manner so as to bury the contact hole CNT. This tungsten film may be formed by using, for example, a CVD method. Moreover, the unnecessary titanium/titanium nitride film and tungsten film formed on the interlayer insulating film IL1 are removed by using, for example, a CMP method so that a plug PLG is formed.

Thereafter, as illustrated in FIG. 6, an interlayer insulating film IL2 made of a thin silicon carbonitride film and a thick silicon oxide film is formed on the interlayer film IL1 and the plug PLG. Next, by using a photolithography technique and an etching technique, a patterning process is carried out on the interlayer insulating film IL2, and the silicon oxide film is etched by using the silicon carbonitride film as an etching stopper. Then, by etching the silicon carbonitride film, wiring trenches are formed on the interlayer insulating film IL2.

Next, a barrier metal film, such as a tantalum nitride film, a tantalum film, or the like, is formed in each of the wiring trenches, and a conductive film mainly composed of copper is formed on the barrier metal film by a plating method or the like. Thereafter, by removing the copper film and the barrier metal film outside the wiring trenches by a CMP method or the like, a wiring L1 buried into the interlayer insulating film IL2 is completed. Thereafter, a multi-layer wiring is formed on the upper layer of the wiring L1; however, explanations thereof are omitted in this case. As described above, the semiconductor device in accordance with the present embodiment can be manufactured.

In accordance with the manufacturing method of a semiconductor device in the present embodiment, the characteristic configuration of the semiconductor device of the present embodiment can be automatically achieved by using a selective epitaxial growth containing dichlorosilane and hydrogen chloride as source gases and is carried out under the same conditions, without the necessity of using complicated processes. In other words, in accordance with the manufacturing method of a semiconductor device in the present embodiment, even in the case when a deviation occurs in the size of the active regions caused by a thermal treatment process, the film thickness of "the raised layer" is automatically adjusted in response to the size of the active region in such a direction as to reduce an electric current deviation caused by the deviation. For this reason, in accordance with the manufacturing method of a semiconductor device in the present embodiment, it becomes possible to suppress performance degradations of a semiconductor device without causing a reduction in the yield.

MODIFICATION EXAMPLE

In the aforementioned embodiment, explanations have been given by exemplifying a configuration in which in a plurality of transistors used in circuits having the same function, although they are formed in active regions having the same size in design value, erosions caused by an oxide film in the respective active regions are different due to a thermal treatment process (oxidation process) applied to the manufacturing process of a semiconductor device, and by changing the thickness of "the raised layer", it becomes possible to reduce electric current deviations in the plural transistors that are subsequently caused. In the present modification example, based upon the premise that a plurality of transistors to be used for circuits having different functions are formed on active regions having different sizes, an explanation will be given to an example in which the thickness of "the raised layer" to be formed on each of the active regions having different sizes is changed.

For example, with respect to the size of field effect transistors used in the SRAM and the size of field effect transistors used in logic circuits, although both of the field effect transistors are constituted by low breakdown voltage transistors, the size of the field effect transistors used in the SRAM is smaller than the size of the field effect transistors used in the logic circuits, because the shrinkage of the SRAM has been achieved. This means that the size of the active region on which the field effect transistor used in the SRAM is formed becomes smaller than the size of the active region on which the field effect transistor used in the logic circuits is formed.

Moreover, even in this configuration, it is considered that erosions caused by oxide films therein occur in the respective active region ACT1 and active region ACT3 during the thermal treatment process (oxidation process) to be applied to the manufacturing process of a semiconductor device. For example, the width of the active region ACT1 on which the field effect transistor Q1 is formed changes from W1A to W1B (W1B<W1A), and the width of the active region ACT3 on which the field effect transistor Q3 is formed changes from W3A to W3B (W3B<W3A). In this case, the influence of the erosion becomes greater as the size of the active region itself becomes smaller. In other words, a reduction in an electric current caused by the erosion of the oxide film toward the active region is considered to be more conspicuous in the field effect transistor Q1 used in the SRAM rather than in the field effect transistor Q3 used in the logic circuits.

Therefore, in the present modification example, the thickness of "the raised layer" of the field effect transistor Q1 used in the SRAM is made larger than the thickness of "the raised layer" of the field effect transistor Q3 fur use in the logic circuits. More specifically, FIG. 18 is a diagram illustrating plane configurations of the field effect transistor Q1 formed in the SRAM formation region SRR and the field effect transistor Q3 formed on a logic circuit formation region LOR. In FIG. 18, in the SRAM formation region SRR, the field effect transistor Q1 is formed in the active region ACT1 having a rectangular shape, sectioned by the device isolation region STI1. In other words, the field effect transistor Q1 has the gate electrode GE1 that extends in the y-direction of FIG. 18 over the active region ACT1, the source region SR1 and the drain region DR1 that are formed in a manner so as to sandwich the gate electrode GE1 within the active region ACT1. At this time, the width of the active region ACT1 in the gate width direction (y-direction) of the gate electrode GE1 is set to W1.

Moreover, the raised source layer EP (S1) is formed on the source region SR1, and a plug PLG is also formed so as to be electrically connected to the raised source layer EP (S1). In the same manner, the raised drain layer EP (D1) is formed on the drain region DR1, and a plug PLG is also formed so as to be electrically connected to the raised drain layer EP (D1). Thus, in the field effect transistor Q1, the source is constituted by the source region SR1 and the raised source layer EP (S1), and the drain is constituted by the drain region DR1 and the raised drain layer EP (D1).

On the other hand, in FIG. 18, in the logic circuit formation region LOR, the field effect transistor Q3 is formed on the active region ACT3 having a rectangular shape that is sectioned by the device isolation region STI3. In other words, the field effect transistor Q3 has a gate electrode GE3 that extends in the y-direction of FIG. 18 over the active region ACT3, as well as a source region SR3 and a drain region DR3 formed in a manner so as to sandwich the gate electrode GE3 within the active region ACT3. At this time, the width of the active region ACT3 in the gate width direction (y-direction) of the gate electrode GE3 is set to W3 (W1<W3). That is, as illustrated in FIG. 18, the width (W1) of the active region ACT1 with the field effect transistor Q1 formed thereon is made smaller than the width (W3) of the active region ACT3 with the field effect transistor Q3 formed thereon.

Moreover, a raised source layer EP (S3) is formed on the source region SR3, and a plug PLG is formed so as to be electrically connected to the raised source layer EP (S3). In the same manner, a raised drain layer EP (D3) is formed on the drain region DR3, and a plug PLG is also formed so as to be electrically connected to the raised drain layer EP (D3). Thus, in the field effect transistor Q3, the source is constituted by the source region SR3 and the raised source layer EP (S3), and the drain is constituted by the drain region DR3 and the raised drain layer EP (D3).

In the present modification example, as illustrated in FIG. 18, the height of the raised source layer EP (S1) formed on the field effect transistor Q1 is made larger than the height of the raised source layer EP (S3) formed on the field effect transistor Q3, and the height of the raised drain layer EP (D1) formed on the field effect transistor Q1 is made larger than the height of the raised drain layer EP (D3) formed on the field effect transistor Q3.

Thus, in accordance with the present modification example, the width (W1) of the active region ACT1 is made relatively small in the field effect transistor Q1 formed on the SRAM formation region SRR; therefore, although an electric current flowing through the field effect transistor Q1 becomes smaller, the height of the raised source layer EP (S1) and the height of the raised drain layer EP (D1) become higher, with the result that a resistance of the source/drain becomes smaller. As a result, in accordance with the present modification example, although the reduction in electric current becomes conspicuous in the field effect transistor Q1 because of the small width (W1) of the active region ACT1, it is possible to suppress the reduction in electric current by making the height of the raised source layer EP (S1) and the height of the raised drain layer EP (D1) higher and by the subsequent reduction in resistance.

As described above, in the present modification example, in a configuration in which the field effect transistor Q3 having a large size in the active region ACT3 and the field effect transistor Q1 having a small size in the active region ACT1 are located, the thickness of "the raised layer" formed in the small field effect transistor Q1 in the active region ACT1 whose electric current reduction becomes conspicuous is made thicker. With this configuration, it becomes possible to effectively suppress the reduction in electric current that becomes conspicuous in the SRAM having a small size in the active region ACT1.

Additionally, the manufacturing method of a semiconductor device in accordance with the present modification example is the same as the manufacturing method of a semiconductor device of the embodiment. In particular, the present modification example is designed based upon the premise that a field effect transistor having a large size of the active region ACT3 and a field effect transistor having a small size of the active region ACT1 are present. For this reason, in the process for forming the device isolation region, the active region ACT1 and the active region ACT3 are sectioned by the device isolation region in such a manner that, for example, the width of the active region ACT1 in the gate width direction of the gate electrode GE1 of the field effect transistor Q1 is made smaller than the width of the active region ACT3 in the gate width direction of the gate electrode GE3 of the field effect transistor Q3.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:
1. A semiconductor device comprising:
 (a) a first field effect transistor formed in a first active region; and
 (b) a second field effect transistor formed in a second active region, wherein the first field effect transistor includes:
- (a1) a first source region and a first drain region which are formed in the first active region so as to be mutually spaced apart from each other;
- (a2) a first channel region sandwiched between the first source region and the first drain region;
- (a3) a first gate insulating film formed on the first channel region;
- (a4) a first gate electrode formed on the first gate insulating film;
- (a5) a first raised source layer formed on the first source region; and
- (a6) a first raised drain layer formed on the first drain region, wherein the second field effect transistor includes:
- (b1) a second source region and a second drain region which are formed in the second active region so as to be mutually spaced apart from each other;
- (b2) a second channel region sandwiched between the second source region and the second drain region;
- (b3) a second gate insulating film formed on the second channel region;
- (b4) a second gate electrode formed on the second gate insulating film;
- (b5) a second raised source layer formed on the second source region; and
- (b6) a second raised drain layer formed on the second drain region, wherein the first active region has a width in a gate width direction of the first gate electrode that is smaller than a width of the second active region in a gate width direction of the second gate electrode, wherein, in a cross-section view, a surface of the first raised source layer is at a height that is higher than a height of a surface of the second raised source layer, and a surface of the first raised drain layer is at a height that is higher than a height of a surface of the second raised drain layer, wherein a width of the first raised source layer in the gate width direction of the first gate electrode is less than a width of the second raised source layer in the gate width direction of the second gate electrode, and a width of the first raised drain layer in the gate width direction of the first gate electrode is less than a width of the second raised drain layer in the gate width direction of the second gate electrode, wherein, in a plan view, an end of the first active region in a gate length direction of the first gate electrode is bounded by a first oxide layer, and an end of the second active region in a gate length direction of the second gate electrode is bounded by a second oxide layer, and wherein, in the plan view, a width of the first oxide layer in the gate length direction of the first gate electrode is greater than a width of the second oxide layer in the gate length direction of the second gate electrode.

2. The semiconductor device according to claim 1,
wherein the height of the surface of the first raised source layer refers to a height at the highest position of the surface of the first raised source layer, and the height of the surface of the second raised source layer refers to a height at the highest position of the surface of the second raised source layer, and wherein the height of the surface of the first raised drain layer refers to a height at the highest position of the surface of the first raised drain layer, and the height of the surface of the second raised drain layer refers to a height at the highest position of the surface of the second raised drain layer.

3. The semiconductor device according to claim 1,
wherein, in a cross-section view, a thickness of the first raised source layer is larger than a thickness of the second raised source layer, and a thickness of the first raised drain layer is larger than a thickness of the second raised drain layer.

4. The semiconductor device according to claim 1,
wherein the first raised source layer includes a silicide film formed on a surface layer thereof, and the second raised source layer includes a silicide film formed on a surface layer thereof, and wherein the first raised drain layer includes a silicide film formed on a surface layer thereof, and the second raised drain layer includes a silicide film formed on a surface layer thereof.

5. The semiconductor device according to claim 1, further comprising:
an SOI substrate including:
- a support substrate;
- a buried insulating layer formed on the support substrate; and
- a silicon layer formed on the buried insulating layer, wherein the first active region and the second active region are formed in the silicon layer of the SOI substrate.

6. The semiconductor device according to claim 5,
wherein a thickness of the first raised source layer measured based upon an upper surface of the silicon layer is made larger than a thickness of the second raised source layer measured based upon the upper surface of the silicon layer, and wherein a thickness of the first raised drain layer measured based upon the upper surface of the silicon layer is made larger than a thickness of the second raised drain layer measured based upon the upper surface of the silicon layer.

7. The semiconductor device according to claim 5,
wherein a thickness of the first raised source layer measured based upon an upper surface of the buried insulating layer is made larger than a thickness of the second raised source layer measured based upon an upper surface of the buried insulating layer, and wherein a thickness of the first raised drain layer measured based upon an upper surface of the buried insulating layer is made larger than a thickness of the second raised drain layer measured based upon the upper surface of the buried insulating layer.

8. The semiconductor device according to claim 1,
wherein the first field effect transistor and the second field effect transistor are components of circuits having the same function.

9. The semiconductor device according to claim 8,
wherein the circuits are logic circuits.

10. The semiconductor device according to claim 8,
wherein the circuits are SRAMs.

11. The semiconductor device according to claim 1,
wherein the first field effect transistor and the second field effect transistor are components of circuits having mutually different functions.

12. The semiconductor device according to claim 11,
wherein the first field effect transistor is a component of an SRAM, and the second field effect transistor is a component of a logic circuit.

13. The semiconductor device according to claim 1, wherein a thickness of the first source and drain regions is substantially equal to a thickness of the second source and drain regions.

14. The semiconductor device according to claim 1, wherein the first source and drain regions comprise a low concentration impurity diffusion region and a high concentration impurity diffusion region, and
wherein the second source and drain regions comprise a low concentration impurity diffusion region and a high concentration impurity diffusion region.

15. The semiconductor device according to claim 1, wherein the first raised source and drain layers and the second raised source and drain layers, comprise an epitaxial silicon layer and a silicide layer formed on the epitaxial silicon layer.

16. The semiconductor device according to claim 1, further comprising:
an interlayer insulating film formed on the first and second raised source layers and the first and second raised drain layers;
first and second contact plugs formed in the interlayer insulating film and contacting the first raised source and drain layers; and
third and fourth contact plugs formed in the interlayer insulating film and contacting the second raised source and drain layers.

17. The semiconductor device according to claim 16, wherein a distance between the first channel region and the first and second contact plugs is greater than a distance between the second channel region and the third and fourth contact plugs.

18. The semiconductor device according to claim 1, wherein the first raised source layer is formed on an upper surface of the first source region, and the second raised source layer is formed on an upper surface of the second source region, and in a cross-section view, a height of the upper surface of the first source region is the same as a height of the upper surface of the second source region.

\* \* \* \* \*